United States Patent
Furukawa et al.

(10) Patent No.: US 11,917,839 B2
(45) Date of Patent: Feb. 27, 2024

(54) HIGH SIGNAL-TO-NOISE RATIO PHOTOELECTRIC CONVERSION ELEMENT

(71) Applicant: SUMITOMO CHEMICAL COMPANY, LIMITED, Tokyo (JP)

(72) Inventors: Daisuke Furukawa, Abiko (JP); Takafumi Araki, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 840 days.

(21) Appl. No.: 16/971,823

(22) PCT Filed: Mar. 22, 2019

(86) PCT No.: PCT/JP2019/012216
§ 371 (c)(1),
(2) Date: Aug. 21, 2020

(87) PCT Pub. No.: WO2019/182143
PCT Pub. Date: Sep. 26, 2019

(65) Prior Publication Data
US 2021/0376274 A1    Dec. 2, 2021

(30) Foreign Application Priority Data
Mar. 23, 2018 (JP) .................. 2018-056657

(51) Int. Cl.
*H10K 50/11* (2023.01)
*H10K 30/30* (2023.01)
(Continued)

(52) U.S. Cl.
CPC ............ *H10K 50/11* (2023.02); *H10K 30/30* (2023.02); *H10K 85/113* (2023.02); *H10K 85/215* (2023.02); *H10K 2101/40* (2023.02)

(58) Field of Classification Search
None
See application file for complete search history.

(56) References Cited

U.S. PATENT DOCUMENTS 9,178,160 B1    11/2015 Facchetti et al.
2012/0205596 A1    8/2012 Yoshimura et al.
(Continued)

FOREIGN PATENT DOCUMENTS

JP        2014-055256 A    3/2014
KR    1020120100899 A    9/2012
(Continued)

OTHER PUBLICATIONS

Office Action issued in corresponding Korean Patent Application No. 10-2020-7029582, dated May 26, 2023.
(Continued)

*Primary Examiner* — Nduka E Ojeh
(74) *Attorney, Agent, or Firm* — Foley & Lardner LLP

(57) ABSTRACT

To improve an SN ratio of a photoelectric conversion element. A photoelectric conversion element (10) includes an anode (12), a cathode (16), an active layer (14) provided between the anode and the cathode, and a hole transport layer (13) provided between the anode and the active layer. The active layer includes a p-type semiconductor material, which is a polymer compound having an absorption peak wavelength of 900 nm or higher, and an n-type semiconductor material, and an energy gap between an LUMO of the n-type semiconductor material contained in the active layer and a HOMO of a hole transport material contained in the hole transport layer is less than 0.9 eV.

22 Claims, 2 Drawing Sheets

(51) Int. Cl.
　　　*H10K 85/10*　　　(2023.01)
　　　*H10K 85/20*　　　(2023.01)
　　　*H10K 101/40*　　(2023.01)

(56) References Cited

U.S. PATENT DOCUMENTS

| | | | | |
|---|---|---|---|---|
| 2015/0075622 | A1* | 3/2015 | Bazan | H10K 85/113 |
| | | | | 438/82 |
| 2016/0133424 | A1 | 5/2016 | Chou et al. | |
| 2016/0351810 | A1 | 12/2016 | Umehara et al. | |
| 2016/0372674 | A1* | 12/2016 | Nakano | C08G 61/126 |
| 2021/0098703 | A1* | 4/2021 | Oshima | H10K 85/60 |
| 2021/0273186 | A1* | 9/2021 | Park | H10K 85/657 |

FOREIGN PATENT DOCUMENTS

| | | |
|---|---|---|
| WO | WO-2013/051676 A1 | 4/2013 |
| WO | WO-2017/170345 A1 | 10/2017 |
| WO | WO-2019/082849 A1 | 5/2019 |

OTHER PUBLICATIONS

Extended European Search Report issued in corresponding European Patent Application No. 19770853.0 dated Dec. 7, 2021.
Wang, T.L., et al., "An extremely low bandgap donor-acceptor copolymer for panchromatic solar cells," Solar Energy Materials & Solar Cells, 107:298-306 (2012).
Wu et al., "Elucidating the Detectivity Limits in Shortwave Infrared Organic Photodiodes," Advanced Functional Materials, vol. 28, No. 18, 2018, pp. 1800391(1) to 1800391(9).
International Searching Authority, "International Search Report," issued in connection with International Patent Application No. PCT/JP2019/012216, dated Jun. 18, 2019.
International Searching Authority, "Written Opinion," issued in connection with International Patent Application No. PCT/JP2019/012216, dated Jun. 18, 2019.
Keivanidis et al., "The Dependence of Device Dark Current on the Active-Layer Morphology of Solution-Processed Organic Photodetectors," Advanced Functional Materials, vol. 20, No. 22, 2010, pp. 3895-3903.

\* cited by examiner

HIGH SIGNAL-TO-NOISE RATIO PHOTOELECTRIC CONVERSION ELEMENT

RELATED APPLICATIONS

The present application claims priority under 37 U.S.C. § 371 to International Patent Application No. PCT/JP2019/012216, filed Mar. 22, 2019, which claims priority to and the benefit of Japanese Patent Application No. 2018-056657, filed on Mar. 23, 2018. The contents of these applications are hereby incorporated by reference in their entireties.

TECHNICAL FIELD

The present invention relates to a photoelectric conversion element such as a light detecting element.

BACKGROUND ART

Photoelectric conversion elements, which are very useful devices for energy consumption reduction and carbon dioxide emission amount reduction, for example, have been drawing a lot of attention.

A photoelectric conversion element is an element at least including a pair of electrodes, which are the anode and cathode, and an active layer between the pair of electrodes. The photoelectric conversion element is configured such that either one of the electrodes is made from a transparent or translucent material, so that light will enter into an organic active layer from above the transparent or translucent electrode. By an energy (hν) of the light entered the organic active layer, electric charges (holes and electrons) are generated in the organic active layer, and the holes thus generated move toward the anode, whereas the electrons move toward the cathode. The electric charges are taken out of the element after reaching either the anode or the cathode.

Especially for a light detecting element among such photoelectric conversion elements, it is required that a phenomenon that current is generated even when no light is radiated thereon, that is, dark current be reduced, and various studies have been made therefor.

For example, it has been reported that the occurrence of dark current is due to electron injection from a hole transport layer into a p-type semiconductor material contained in the active layer, and that, for reduction of dark current, an energy gap (hereinafter, which may be referred to as ΔE) between an LUMO (Lowest Unoccupied Molecular Orbital) of an n-type semiconductor material contained in the active layer and a HOMO (Highest Occupied Molecular Orbital) of a hole transport material contained in the hole transport layer should be larger (see Non-Patent Document 1).

PRIOR ART DOCUMENTS

Non-Patent Document

Non-Patent Document 1: Adv. Funct. Mater. 2010, 20, 3895-3903

SUMMARY OF THE INVENTION

Problems to be Solved by the Invention

However, a conventional light detecting element is not sufficient in terms of the reduction of dark current, and further improvement of an SN ratio.

Means for Solving the Problems

As a result of diligent studies to solve the problem, the present inventors found that, in case where an absorption peak wavelength of the p-type semiconductor material contained in the active layer is 900 nm or higher, this problem can be solved by adjusting ΔE to be smaller, on the contrary to the suggestion made in the report of Non-Patent Document 1, thereby accomplishing the present invention. That is, the present invention provides the following [1] to [8].

[1] A photoelectric conversion element, including an anode, a cathode, an active layer provided between the anode and the cathode, and a hole transport layer provided between the anode and the active layer, in which the active layer includes a p-type semiconductor material, which is a polymer compound having an absorption peak wavelength of 900 nm or higher, and an n-type semiconductor material, and in which an energy gap between an LUMO of the n-type semiconductor material contained in the active layer and a HOMO of a hole transport material contained in the hole transport layer is less than 0.9 eV.

[2] The photoelectric conversion element according to [1], in which the absorption peak wavelength of the p-type semiconductor material is not less than 900 nm but not more than 2000 nm, and the energy gap is in a range of 0.5 eV to 0.8 eV.

[3] The photoelectric conversion element according to [1] or [2], in which the n-type semiconductor material is a fullerene derivative.

[4] The photoelectric conversion element according to [3], in which the fullerene derivative is one or more compounds selected from the group consisting of compounds represented by formulae (N-a) to (N-f) below,

[Chem. 1]

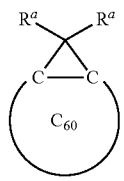

(N-a)

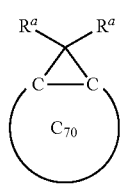

(N-b)

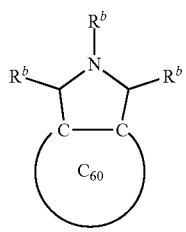

(N-c)

-continued

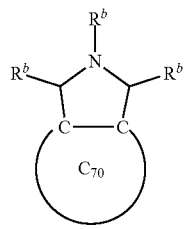

(N-d)

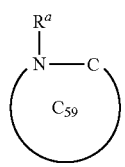

(N-e)

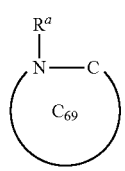

(N-f)

in which $R^a$ is an alkyl group, an aryl group, a monovalent heterocyclic group, or a group having an ester structure, where if there are a plurality of $R^a$ in the formula, the plurality of $R^a$ may be identical with or different from one another, and $R^b$ is an alkyl group or an aryl group, where if there are a plurality of $R^b$ in the formula, the plurality of $R^b$ may be identical with or different from one another.

[5] The photoelectric conversion element according to [4], in which the fullerene derivative is the compound represented by formula (N-a), (N-b), (N-e), or (N-f).

[6] The photoelectric conversion element according to [5], in which the fullerene derivative is $C_{60}$PCBM or KLOC-6.

[7] The photoelectric conversion element according to any one of [1] to [6], in which the p-type semiconductor material is a polymer compound having a structural unit having a thiophene skeleton.

[8] The photoelectric conversion element according to any one of [1] to [7], being a light detecting element.

Effect of the Invention

According to the photoelectric conversion element of the present invention, the dark current can be further reduced, whereby it further becomes possible to effectively improve the SN ratio.

MODE FOR CARRYING OUT THE INVENTION

Figure 1:
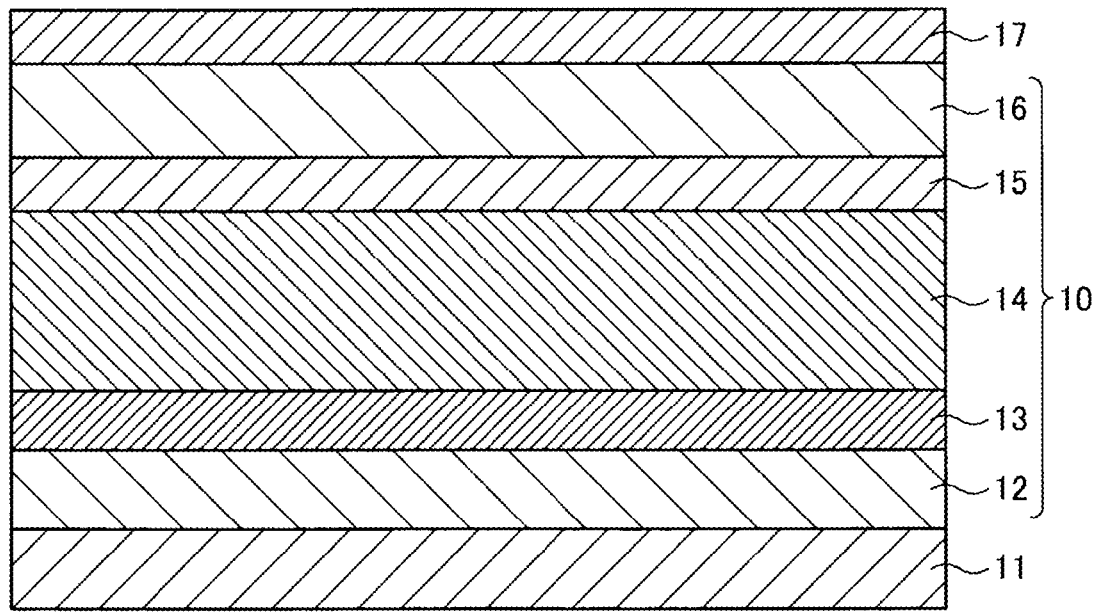
FIG. 1 is a view schematically illustrating a configuration example of a photoelectric conversion element.

In the following, a photoelectric conversion element according to one embodiment of the present invention will be described, referring to the drawings. It should be noted that the drawings are merely such schematic illustrations of the shapes, sizes, and arrangements of constituent elements that are just intended to make the present invention readily understandable. The present invention is not limited to the following descriptions, and each constituent element may be modified as appropriate within the gist of the present invention. Moreover, the configuration according to the embodiment of the present invention may be manufactured or used with an arrangement not illustrated in the drawings.

1. Photoelectric Conversion Element

A photoelectric conversion element according to the present embodiment includes an anode, a cathode, an active layer provided between the anode and the cathode, and a hole transport layer provided between the anode and the active layer. The active layer includes a p-type semiconductor material, which is a polymer compound having an absorption peak wavelength of 900 nm or higher, and an n-type semiconductor material, and an energy gap between an LUMO of the n-type semiconductor material contained in the active layer and a HOMO of a hole transport material contained in the hole transport layer is less than 0.9 eV.

Here, what is meant by the "energy gap between an LUMO of an n-type semiconductor material contained in the active layer and a HOMO of a hole transport material contained in the hole transport layer" is a value (eV) obtained by subtracting a value (eV) corresponding to an energy level of the HOMO of the hole transport material from a value (eV) corresponding to an energy level of the LUMO of the n-type semiconductor material.

In the following, a configuration example employable by a photoelectric conversion element according to the present embodiment will be described. FIG. 1 is a view schematically illustrating a photoelectric conversion element according to the present embodiment.

As illustrated in FIG. 1, a photoelectric conversion element 10 is provided on a support substrate 11, and includes an anode 12 provided in contact with the support substrate 11, a hole transport layer 13 provided in contact with the anode 12, an active layer 14 provided in contact with the hole transport layer 13, an electron transport layer 15 provided in contact with the active layer 14, and a cathode 16 provided in contact with the electron transport layer 15. In this configuration example, a sealing member 17 is provided on the cathode 16 in such a way that the sealing member 17 covers the photoelectric conversion element 10. Hereinafter, the photoelectric conversion element according to the present embodiment will be described in more detail.

(Substrate)

The photoelectric conversion element is generally formed on a substrate (support substrate). On this substrate, electrodes including the cathode and the anode are formed in general. A material of the substrate is not particularly limited, as long as the material will not be chemically changed especially in forming a layer containing an organic compound.

Examples of the material of the substrate include glass, plastic, polymer films, and silicon. If the substrate is opaque, it is preferable that the electrode opposite to the electrode closer to the opaque substrate be transparent or translucent (that is, the electrode farther to the opaque electrode be transparent or translucent).

(Electrode)

The photoelectric conversion element includes at least one pair of the anode and the cathode. It is preferable that at least one of the anode and the cathode be transparent or translucent, so that light can enter therethrough into the photoelectric conversion element.

Examples of transparent or translucent materials of the electrodes include electrically conductive metal oxide films, translucent metal thin films, and the like. Concrete Examples of the transparent or translucent electrode include: indium oxide, zinc oxide, tin oxide, and a complex of these such as indium tin oxide (ITO) and indium zinc oxide (IZO); electrically conductive materials such as NESA; and gold, platinum, silver, and copper. As the material of the transparent or translucent electrode, ITO, IZO, and tin oxide are preferable. Moreover, as the electrode, a transparent conductive film whose material is an organic compound such as polyaniline or a derivative thereof, or polythiophene or derivative thereof, may be used. The transparent or translucent electrode may be the anode or the cathode.

As long as one of the electrodes is transparent or translucent, the other one of the electrodes may be an electrode low in light transparency. Examples of a material of the electrode low in light transparency include metals and electrically conductive polymers. Concrete examples of such a material of the electrode low in light transparency include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, alloys of two or more kinds of them, alloys of at least one of them and at least one kind of metal selected from the group consisting of gold, silver, platinum, copper, manganese, titanium, cobalt, nickel, tungsten, and tin, graphite, graphite intercalation compounds, polyaniline and derivatives thereof, and polythiophene and derivatives thereof. Examples of the alloys include magnesium-silver alloy, magnesium-indium alloy, magnesium-aluminum alloy, indium-silver alloy, lithium-aluminum alloy, lithium-magnesium alloy, lithium-indium alloy, and calcium-aluminum alloy.

(Active Layer)

The active layer includes p-type semiconductor material (electron donor compound) and n-type semiconductor material (electron acceptor compound).

In the present embodiment, the active layer includes, as a p-type semiconductor material, a polymer compound having an absorption peak wavelength of 900 nm or higher.

Here, the "absorption peak wavelength" is a parameter specified based on absorption peaks of absorption spectrum measured with a predetermined wavelength range, and a wavelength of an absorption peak with the highest absorbance among the absorption peaks of absorption spectrum.

The absorption peak wavelength of the polymer compound serving as the p-type semiconductor material may be preferably not less than 900 nm but not more than 2000 nm, or more preferably not less than 1400 nm but not more than 2000 nm, for example, for the sake of the use of the photoelectric conversion element as a light detecting element, especially in consideration of performing light sensing with use of a wavelength that is hardly harmful to human eyes.

Because the present embodiment is configured such that the energy gap between the LUMO of the n-type semiconductor material contained in the active layer and the HOMO of the hole transport material contained in the hole transport layer is less than 0.9 eV, the p-type semiconductor material is selected in order to meet the requirement in consideration of the value of the HOMO of the hole transport material selected.

In the active layer, whether compounds selected will function as the p-type semiconductor material or the n-type semiconductor material can be determined from relative values of the HOMO or LUMO of the compounds selected.

Suitable p-type semiconductor materials and n-type semiconductor materials in the present embodiment will be described herein, respectively. Firstly, the terms commonly used in the explanation below will be explained.

What is meant by the "polymer compound" is a polymer having a molecular weight distribution and has a number average molecular weight (based on polystyrene) of not less than $1\times10^3$ but not more than $1\times10^8$. Structural units contained in the polymer compound amount 100 mol % in total.

What is meant by the "structural units" are units that are present in the polymer compound in such a way that the number of each of the units contained in the polymer compound is one or more.

A "hydrogen atom" may be a light hydrogen atom or a heavy hydrogen atom.

Examples of a "halogen atom" include a fluorine atom, a chlorine atom, a bromine atom, and an iodine atom.

An aspect described as "may be substituted" encompasses both of a case where all of hydrogen atoms constituting the compound or the group are unsubstituted, and a case where one or more of the hydrogen atoms are partially or wholly substituted with a substituent or substituents.

An "alkyl group" may be linear, branched, or cyclic, unless otherwise specified. The number of carbon atoms in the linear alkyl group, excluding the number of carbon atoms in the substituent(s), is generally in a range of 1 to 50, preferably in a range of 1 to 30, or more preferably in a range of 1 to 20. The number of carbon atoms in the branched or cyclic alkyl group, excluding the number of carbon atoms in the substituent(s), is generally in a range of 3 to 50, preferably in a range of 3 to 30, or more preferably in a range of 4 to 20.

The alkyl group may be substituted. Concrete examples of the alkyl group include: alkyl groups such as methyl group, ethyl group, n-propyl group, isopropyl group, n-butyl group, an isobutyl group, tert-butyl group, n-pentyl group, isopentyl group, 2-ethylbutyl group, n-hexyl group, cyclohexyl group, n-heptyl group, cyclohexylmethyl group, cyclohexylethyl group, n-octyl group, 2-ethylhexyl group, 3-n-propylheptyl group, adamantyl group, n-decyl group, 3,7-dimethyloctyl group, 2-ethyloctyl group, 2-n-hexyl-decyl group, n-dodecyl group, tetradecyl group, hexadecyl tomb, octadecyl group, and eicosyl group; and substituted alkyl group such as trifluoromethyl group, pentafluoroethyl group, perfluorobutyl group, perfluorohexyl group, perfluorooctyl group, 3-phenylpropyl group, 3-(4-methylphenyl)propyl group, 3-(3,5-di-n-hexylphenyl) propyl group, and 6-ethyloxylhexyl group.

What is meant by an "aryl group" is an atom group that is a residue of an aromatic hydrocarbon which may be substituted and from which one hydrogen atom directly bonding to a carbon atom constituting a ring is removed.

The aryl group may be substituted. Concrete examples of the aryl group include phenyl group, 1-naphthyl group, 2-naphthyl group, 1-anthracenyl group, 2-anthracenyl group, 9-anthracenyl group, 1-pyrenyl group, 2-pyrenyl group, 4-pyrenyl group, 2-fluorenyl group, 3-fluorenyl group, 4-fluorenyl group, 2-phenylphenyl group, 3-phenylphenyl group, 4-phenylphenyl group, and aryl groups substituted with an alkyl group(s), an alkoxy group(s), an aryl group(s), a fluorine atom(s) or the like.

An "alkoxy group" may be linear, branched, or cyclic. The number of carbon atoms in the linear alkoxy group, excluding the number of carbon atoms in the substituent(s), is generally in a range of 1 to 40, or preferably in a range of 1 to 10. The number of carbon atoms in the branched or cyclic alkoxy group, excluding the number of carbon atoms in the substituent(s), is generally in a range of 3 to 40, or preferably in a range of 4 to 10.

The alkoxy group may be substituted. Concrete examples of the alkoxy group include methoxy group, ethoxy group, n-propyloxy group, isopropyloxy group, n-butyloxy group, isobutyloxy group, tert-butyloxy group, n-pentyloxy group, n-hexyloxy group, cyclohexyloxy group, n-heptyloxy group, n-octyloxy group, 2-ethylhexyloxy group, n-nonyloxy group, n-decyloxy group, 3,7-dimethyloctyloxy group, and lauryloxy group.

The number of carbon atoms in an "aryloxy group," excluding the number of carbon atoms in the substituent(s), is generally in a range of 6 to 60, or preferably in a range of 6 to 48.

The aryloxy group may be substituted. Concrete examples of the aryloxy group include phenoxy group, 1-naphthyloxy group, 2-naphthyloxy group, 1-anthracenyloxy group, 9-anthracenyloxy group, 1-pyrenyloxy group, and aryloxy groups substituted with an alkyl group(s), an alkoxy group(s), a fluorine atom(s), or the like.

An "alkylthio group" may be linear, branched, or cyclic. The number of carbon atoms in the linear alkylthio group, excluding the number of carbon atoms in the substituent(s), is generally in a range of 1 to 40, or preferably in a range of 1 to 10. The number of carbon atoms in the branched and cyclic alkylthio group, excluding the number of carbon atoms in the substituent(s), is generally in a range of 3 to 40, or preferably in a range of 4 to 10.

The alkylthio group may be substituted. Concrete examples of the alkylthio group include methylthio group, ethylthio group, propylthio group, isopropylthio group, butylthio group, isobutylthio group, tert-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, and trifluoromethylthio group.

The number of carbon atoms in an "arylthio group," excluding the number of carbon atoms in the substituent(s), is generally in a range of 6 to 60, or preferably in a range of 6 to 48.

The arylthio group may be substituted. Examples of the arylthio group include phenylthio group, C1 to C12 alkyloxyphenylthio groups (where the expression "C1 to C12" indicates that the groups recited right after the expression is such that the number of carbon atoms in the groups themselves is in a range of 1 to 12. The like expression hereinafter has the like meaning), C1 to C12 alkylphenylthio group, 1-naphtylthio group, 2-naphtylthio group, and pentafluorophenylthio group.

What is meant by a "p-valent heterocyclic group" (where p is an integer equal to or more than 1) is an atom group which is a residue of a heterocyclic compound that may be substituted and from which p ones of hydrogen atoms directly bonding to carbon atoms or a hetero atom(s) constituting the ring are removed. The p-valent heterocyclic group encompasses "p-valent aromatic heterocyclic group." What is meant by a "p-valent aromatic heterocyclic group" is an atom group which is a residue of an aromatic heterocyclic compound that may be substituted and from which p ones of hydrogen atoms directly bonding to carbon atoms or a hetero atom(s) constituting the ring are removed.

Examples of substituents that the heterocyclic compound may have include halogen atoms, alkyl group, aryl group, alkoxy group, aryloxy group, alkylthio group, arylthio group, monovalent heterocyclic groups, substituted amino group, acyl group, imine residue, amide group, acid imide group, substituted oxy carbonyl group, alkenyl group, alkynyl group, cyano group, and nitro group.

The aromatic heterocyclic compound encompasses compounds, whose heterocyclic ring itself is not aromatic but is fused with an aromatic ring(s), as well as compounds whose heterocyclic ring itself is aromatic.

Among the aromatic heterocyclic compounds, concrete examples of the compounds, whose heterocyclic ring itself is aromatic include oxadiazole, thiadiazole, thiazole, oxazole, thiophene, pyrrole, phosphole, furan, pyridine, pyrazine, pyrimidine, triazine, pyridazine, quinoline, isoquinoline, carbazole, and dibenzophoshole.

Among the aromatic heterocyclic compounds, concrete examples of the compounds, whose heterocyclic ring itself is not aromatic but is fused with an aromatic ring(s) include phenoxazine, phenothiazine, dibenzoborole, dibenzosilole, and benzopyran.

The number of carbon atoms in a monovalent heterocyclic group, excluding the number of carbon atoms in the substituent(s), is generally in a range of 2 to 60, or preferably in a range of 4 to 20.

The monovalent heterocyclic group may be substituted, and concrete examples of the monovalent heterocyclic group include thienyl group, pyrrolyl group, furyl group, pyridyl group, piperidyl group, quinolyl group, isoquinolyl group, pyrimidinyl group, triazinyl group, and monovalent heterocyclic groups substituted with an alkyl group(s), an alkoxy group(s), or the like.

What is meant by the "substituted amino group" is an amino group substituted with a substituent(s). The substituent(s) of the amino group may be preferably an alkyl group, an aryl group, or a monovalent heterocyclic group. The number of carbon atoms in the substituted amino group is generally in a range of 2 to 30.

Examples of the substituted amino group include: dialkylamino groups such as dimethylamino group and diethylamino group; and diarylamino group such as diphenylamino group, bis(4-methylphenyl)amino group, bis(4-tert-butylphenyl)amino group, and bis(3,5-di-tert-butylphenyl) amino group.

The number of carbon atoms in the "acyl group" is generally in a range of 2 to 20, or preferably 2 to 18. Concrete examples of the acyl group include acetyl group, propionyl group, butyryl group, isobutyryl group, pivaloyl group, benzoyl group, trifluoroacetyl group, and pentafluorobenzoyl group.

What is meant by the "imine residue" is an atom group which is a residue of an imine and from which one hydrogen atom directly bonding to the carbon atom or nitrogen atom constituting the carbon atom-nitrogen atom double bond is removed. What is meant by "imine" is an organic compound having a carbon atom-nitrogen atom double bond in its molecule. Examples of imine include a compound which is aldimine, ketimine, or aldimine in which one hydrogen atom bonding to the nitrogen atom constituting the carbon atom-nitrogen atom double bond is substituted with an alkyl group or the like.

The number of carbon atoms in the imine residue is generally in a range of 2 to 20, or preferably 2 to 18. Examples of the imine residue include groups represented by the following structural formulae.

[Chem. 2]

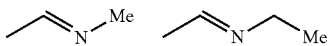

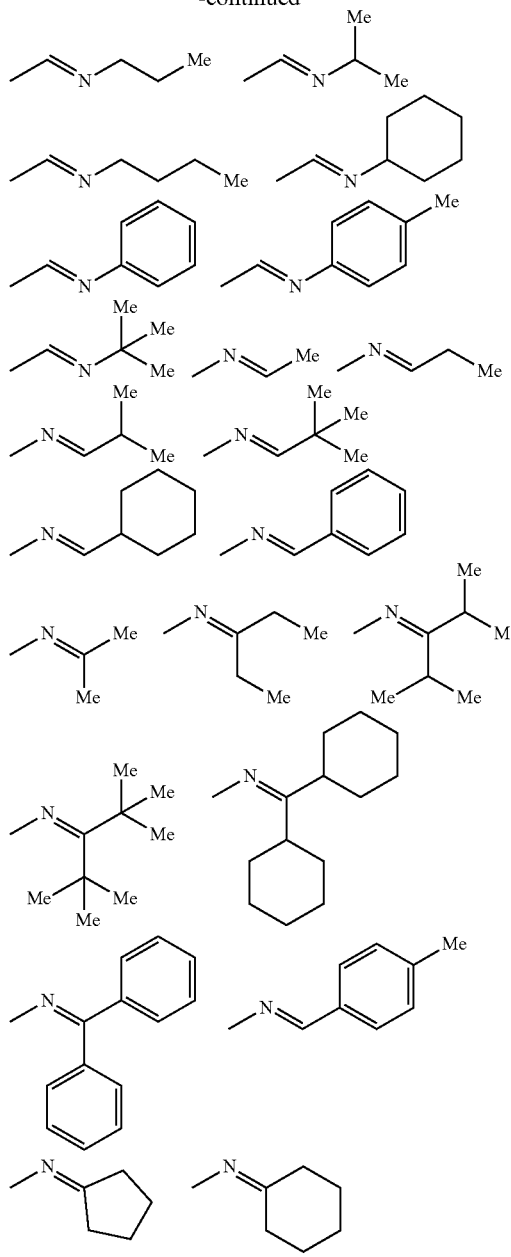

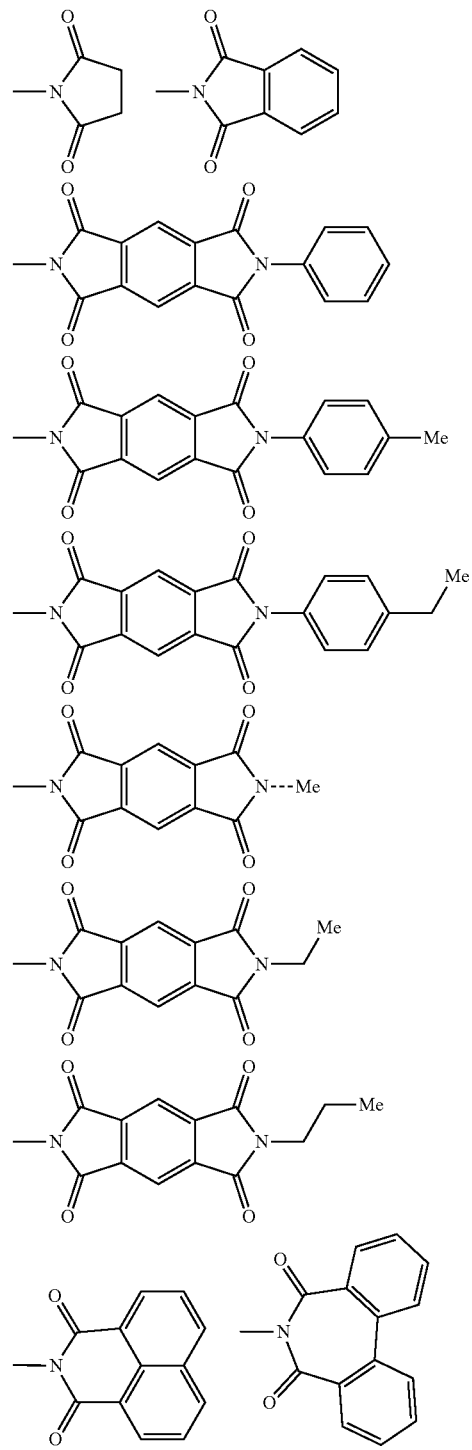

in a range of 4 to 20. Concreate examples of the acid imide group include groups represented by the following structural formulae.

[Chem. 3]

What is meant by the "amide group" is an atom group that is the residue of an amide from which one hydrogen atom bonding to the nitrogen atom is removed. The number of carbon atoms in the amide group is generally in a range of 1 to 20, or preferably in a range of 1 to 18. Concrete examples of the amide group include formamide group, acetoamide group, propioamide group, butyloaminde group, benzamide group, trifluoroacetoamide group, pentafluorobenzamide group, diformamide group, diacetoamide group, dipropioamide group, dibutyloamide group, dibenzamide group, ditrifluoroacetoamide group, and dipentafluorobenzamide group.

What is meant by the "acid imide group" is an atom group that is the residue of an acid imide from which one hydrogen atom bonding with the nitrogen atom is removed. The number of carbon atoms of the acid imide group is generally What is meant by the "substituted oxy carbonyl group" is a group represented by R'—O—(C=O)—. Here, R' is an alkyl group, an aryl group, an arylalkyl group, or a monovalent heterocyclic group.

The number of carbon atoms of the substituted oxy carbonyl group is generally in a range of 2 to 60, or preferably 2 to 48.

Concrete examples of the substituted oxy carbonyl group include methoxy carbonyl group, ethoxy carbonyl group, propoxy carbonyl group, isoproxy carbonyl group, butoxy carbonyl group, isobutoxy carbonyl group, tert-butoxy carbonyl group, pentyloxy carbonyl group, hexyloxy carbonyl group, cyclohexyloxy carbonyl group, heptyloxy carbonyl group, octyloxy carbonyl group, 2-ethylhexyloxy carbonyl group, nonyloxy carbonyl group, decyloxy carbonyl group, 3,7-dimethyloctyloxy carbonyl group, dodecyloxy carbonyl group, trifluoromethoxy carbonyl group, pentafluoroethoxy carbonyl group, perfluorobutoxy carbonyl group, perfluorohexyloxy carbonyl group, perfluorooctyloxy carbonyl group, phenoxy carbonyl group, naphthoxy carbonyl group, and pyridyloxy carbonyl group.

An "alkenyl group" may be linear, branched, or cyclic. The number of carbon atoms in the linear alkenyl group, excluding the number of carbon atoms in the substituent(s), is generally in a range of 2 to 30, or preferably in a range of 3 to 20. The number of carbon atoms in the branched or cyclic alkenyl group, excluding the number of carbon atoms in the substituent(s), is generally in a range of 3 to 30, or preferably in a range of 4 to 20.

The alkenyl group may be substituted. Concreate examples of the alkenyl group include vinyl group, 1-propenyl group, 2-propenyl group, 2-butenyl group, 3-butenyl group, 3-pentenyl group, 4-pentenyl group, 1-hexenyl group, 5-hexenyl group, 7-octenyl group, and alkenyl groups substituted with an alkyl group(s), an alkoxy group(s), or the like.

An "alkynyl group" may be linear, branched, or cyclic. The number of carbon atoms in the linear alkenyl group, excluding the number of carbon atoms in the substituent(s), is generally in a range of 2 to 20, or preferably in a range of 3 to 20. The number of carbon atoms in the branched or cyclic alkenyl group, excluding the number of carbon atoms in the substituent(s), is generally in a range of 4 to 30, or preferably in a range of 4 to 20.

The alkynyl group may be substituted. Concrete examples of alkynyl group include ethynyl group, 1-propynyl group, 2-propynyl group, 2-butynyl group, 3-butynyl group, 3-pentynyl group, 4-pentynyl group, 1-hexynyl group, 5-hexynyl group, and alkynyl groups substituted with an alkyl group(s), an alkoxy group(s), or the like.

(p-Type Semiconductor Material)

The p-type semiconductor material for the photoelectric conversion element according to the present embodiment is a p-type semiconductor material having an absorption peak wavelength of 900 nm or higher.

It is preferable that the p-type semiconductor material be a polymer compound having a predetermined weight average molecular weight based on polystyrene.

Here, what is meant by the weight average molecular weight based on polystyrene is a weight average molecular weight worked out by using gel permeation chromatography (GPC) with polystyrene used as a control sample.

The p-type semiconductor material is preferably such that the weight average molecular weight thereof based on polystyrene be not less than 3000 but not more than 500000, especially for better solubility in a solvent.

Examples of the p-type semiconductor material being the polymer compound include polyvinyl carbazole and derivatives thereof, polysilane and derivatives thereof, polysiloxane derivatives having an aromatic amine structure in their side chain or main chain, polyaniline and derivatives thereof, polythiophene and derivatives thereof, polypyrrole and derivatives thereof, polyphenylene vinylene and derivatives thereof, and polythienylene vinylene and derivatives thereof, polyfluorene and derivatives thereof, and the like.

Moreover, the p-type semiconductor material may be preferably a polymer compound having a structural unit represented by the following formula (I) and/or a structural unit represented by the following formula (II).

[Chem. 4]

(I)

In the formula (I), $Ar^1$ and $Ar^2$ are trivalent aromatic heterocyclic groups, and Z is a group represented by formulae (Z-1) to (Z-7).

[Chem. 5]

(II)

In the formula (II), $Ar^3$ is a divalent aromatic heterocyclic group.

[Chem. 6]

(Z-1)

(Z-2)

(Z-3)

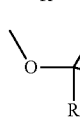

(Z-4)

(Z-5)

(Z-6)

(Z-7)

In the formulae (Z-1) to (Z-7), R is a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acid imide group, a substituted oxy carbonyl group, an alkenyl group, an alkynyl group, a cyano group, or a nitro group. In each of the formulae (Z-1) to (Z-7), if there are two Rs in the formula, the two Rs may be identical with or different from each other.

The structural unit represented by formula (I) may be preferably a structural unit represented by the following formula (I-1).

[Chem. 7]

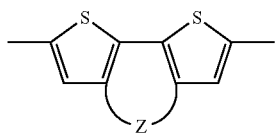
(I-1)

In the formula (I-1), Z is the same as above.

Examples of the structural units represented by formula (I-1) include structural units represented by the following formulae (501) to (505).

[Chem. 8]

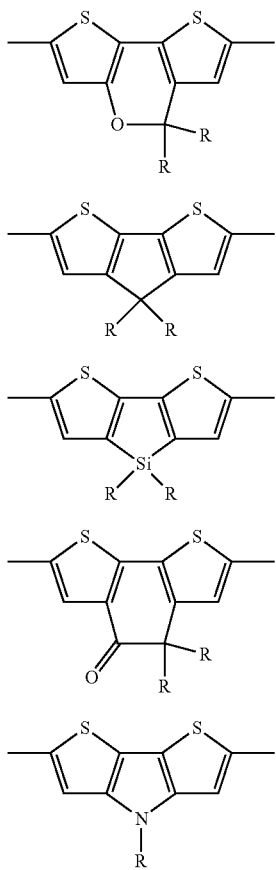

(501)

(502)

(503)

(504)

(505)

In the formulae (501) to (505), R is the same as above, Where if there are two Rs in the formula, the two Rs may be identical with or different from each other.

The number of carbon atoms in the divalent aromatic heterocyclic group indicated as $Ar^3$ is generally in a range of 2 to 60, preferably in a range of 4 to 60, or more preferably in a range of 4 to 20. The divalent aromatic heterocyclic group indicated as $Ar^3$ may be substituted. Examples of substituents that the divalent aromatic heterocyclic group indicated as $Ar^3$ may have include halogen atoms, alkyl group, aryl group, alkoxy group, aryloxy group, alkylthio group, arylthio group, monovalent heterocyclic groups, substituted amino group, acyl group, imine residue, amide group, acid imide group, substituted oxy carbonyl group, alkenyl group, alkynyl group, cyano group, and nitro group.

Examples of the divalent aromatic heterocyclic group indicated as $Ar^3$ include groups represented by the following formulae (101) to (185).

[Chem. 9]

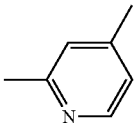
(101)

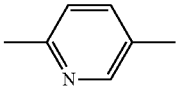
(102)

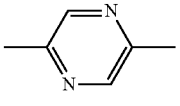
(103)

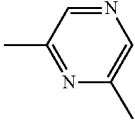
(104)

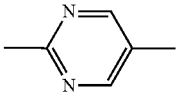
(105)

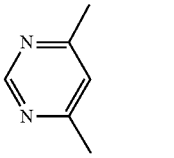
(106)

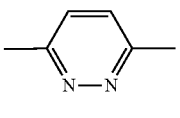
(107)

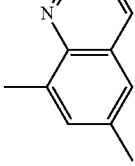
(108)

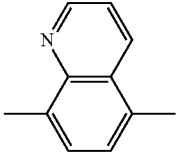
(109)

(110) 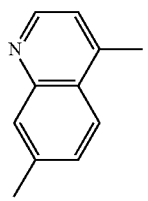
(111) 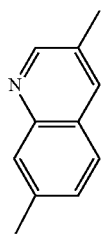
(112) 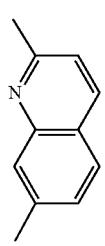
(113) 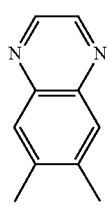
(114) 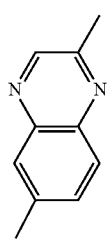
(115) 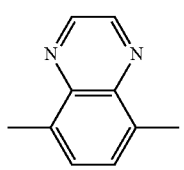
[Chem. 10]
(116) 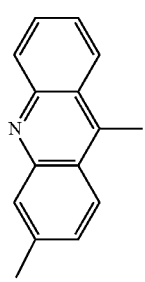
(117) 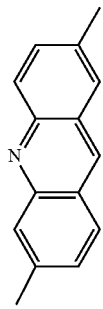
(118) 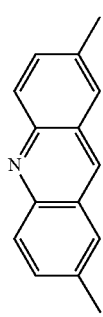
(119) 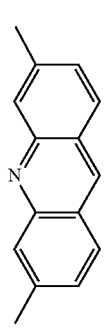
(120) 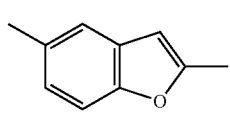
(121) 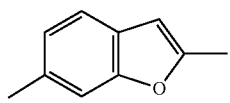
(122) 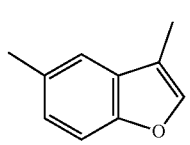
(123)
(124) 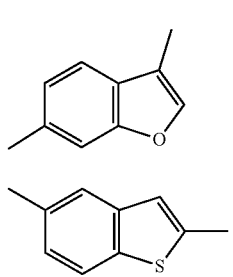

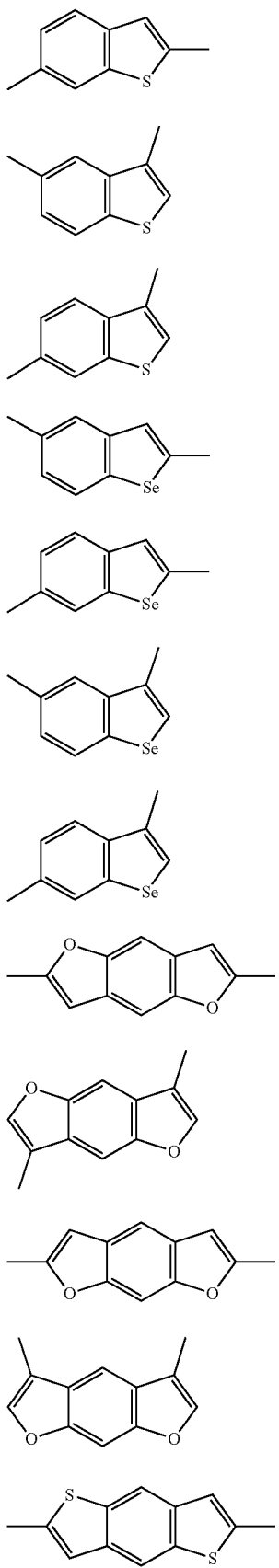
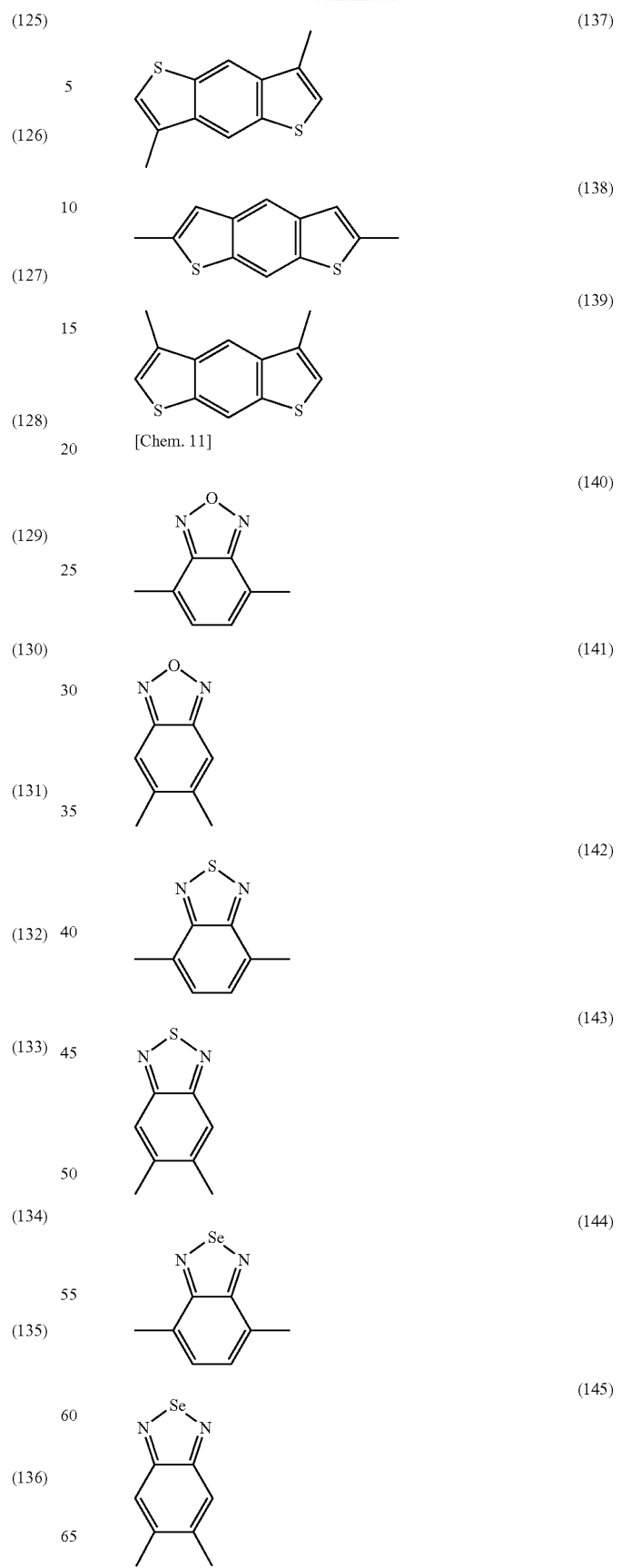

(146) 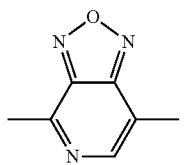
(147) 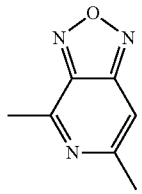
(148) 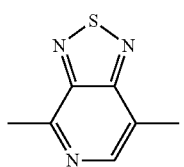
(149) 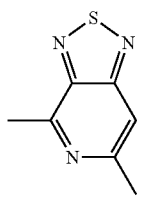
(150) 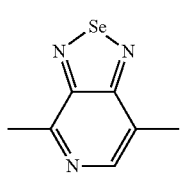
(151) 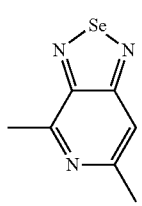
(152) 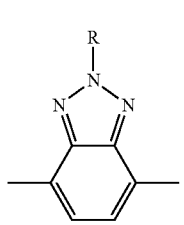
(153) 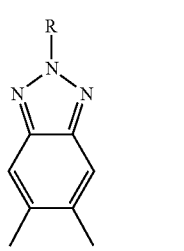
(154) 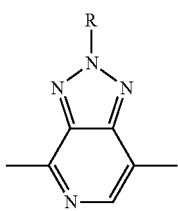
(155) 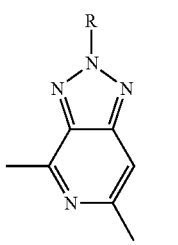
(156) 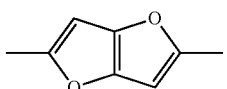
(157) 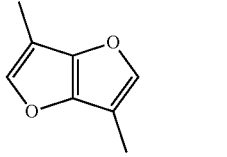
(158) 
(159) 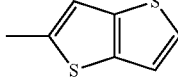
(160) 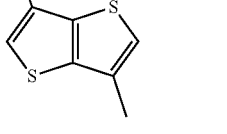
(161) 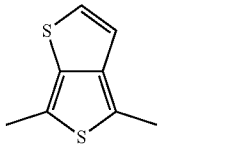

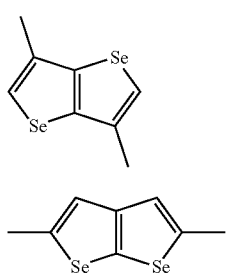
(165)
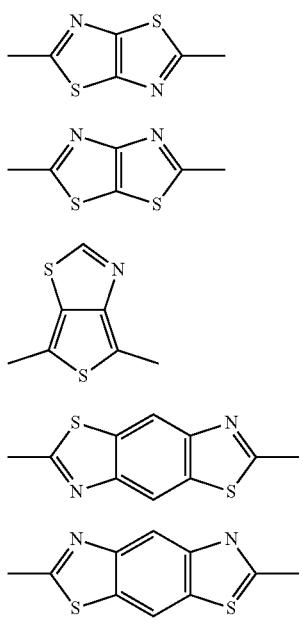
[Chem. 12]
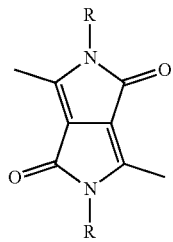
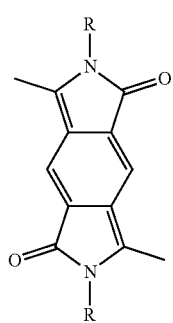
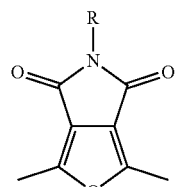
(175)
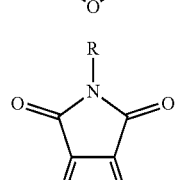
(176)
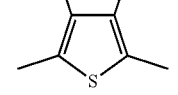
(177)
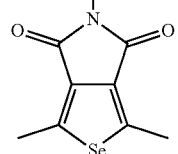
(178)
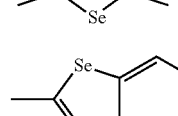
(179)
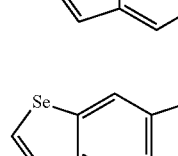
(180)
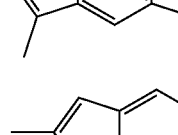
(181)
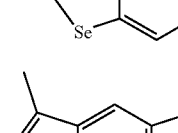
(182)
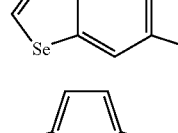
(183)
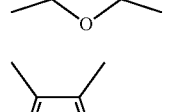
(184)
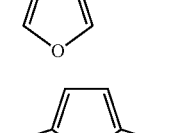
(185)
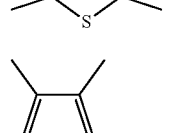
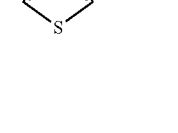

In the formulae (101) to (185), R is the same as above, where if there are a plurality of Rs in the formula, the plurality of Rs may be identical with or different from one another.

As the structural unit represented by formula (II), structural units represented by formula (II-1) to (II-6) are preferable.

[Chem. 13]

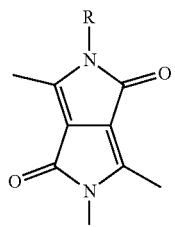
(II-1)

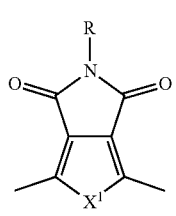
(II-2)

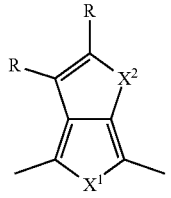
(II-3)

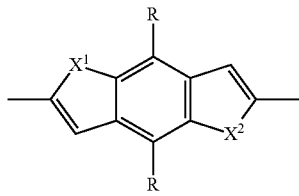
(II-4)

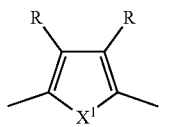
(II-5)

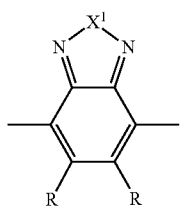
(II-6)

In the formulae (II-1) to (II-6), $X^2$ and $X^2$ are independently an oxygen atom or a sulfur atom, and R is the same as above, where if there are a plurality of Rs in the formula, the plurality of Rs may be identical with or different from one another.

For the sake of availability of raw material compounds, it is preferable that both of $X^2$ and $X^2$ be a sulfur atom in formulae (II-1) to (II-6).

The p-type semiconductor material may be preferably a polymer compound having a structural unit having a thiophene skeleton.

The polymer compound being the p-type semiconductor material may contain two or more kinds of the structural units represented by formula (I), and may contain two or more kinds of the structural units represented by formula (II).

For the sake of better solubility in the solvent, the polymer compound being the p-type semiconductor material may contain a structural unit represented by the following formula (III).

[Chem. 14]

(III)

In the formula (III), $Ar^4$ is an arylene group.

The arylene group represented by $Ar^4$ is an atom group that is the residue of an aromatic hydrocarbon which may be substituted and from which two hydrogen atoms are removed. The aromatic hydro carbon also encompasses compounds having a fused ring, and compounds in which two or more rings selected from the group consisting of an independent benzene ring and fused rings are bonded together directly or via a divalent group such as a vinylene group.

Examples of substituents that the aromatic hydrocarbon may have include the same substituents as those exemplified as the substituents that the heterocyclic compound may have.

The number of carbon atoms in the arylene group, excluding the substituent, is generally in a range of 6 to 60, or preferably in a range of 6 to 20. The number of carbon atoms in the arylene group, including the substituent, is generally in a range of 6 to 100.

Examples of the arylene group include phenylene group (for example, the following formulae 1 to 3), naphthalene-diyl group (for example, the following formulae 4 to 13), anthracene-diyl group (for example, the following formulae 14 to 19), biphenyl-diyl group (for example, the following formulae 20 to 25), terphenyl-diyl group (for example, the following formulae 26 to 28), fused cyclic compound group (for example, the following formulae 29 to 35), fluorene-diyl group (for example, the following formulae 36 to 38), and benzofluorene-diyl group (for example, the following formulae 39 to 46).

[Chem. 15]

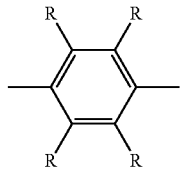
1

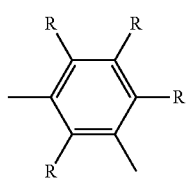
2

-continued
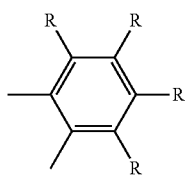
[Chem. 16]
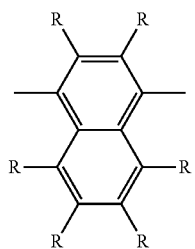
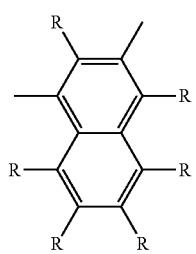
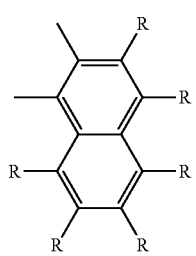
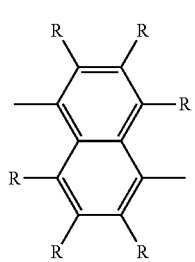
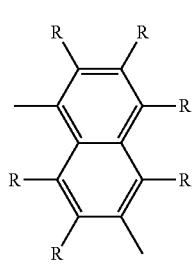
-continued
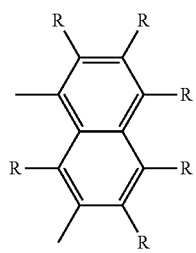
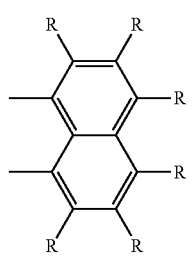
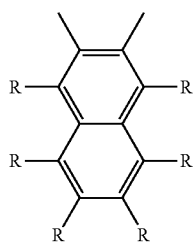
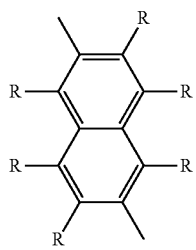
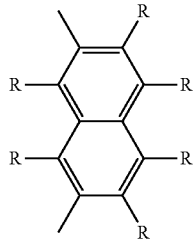
[Chem. 17]
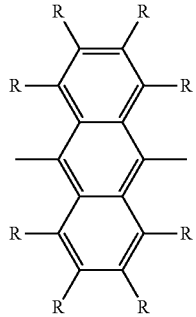

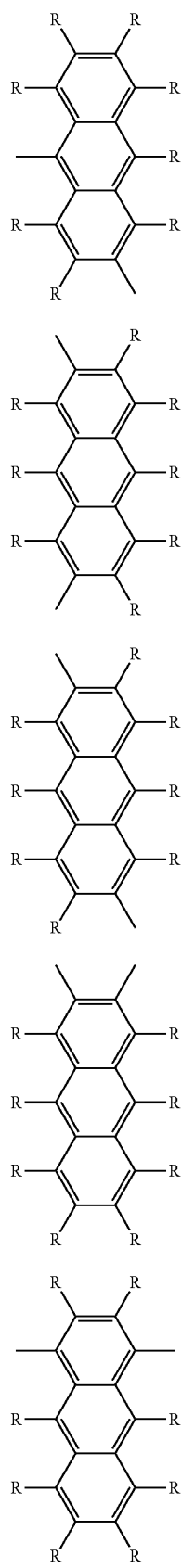
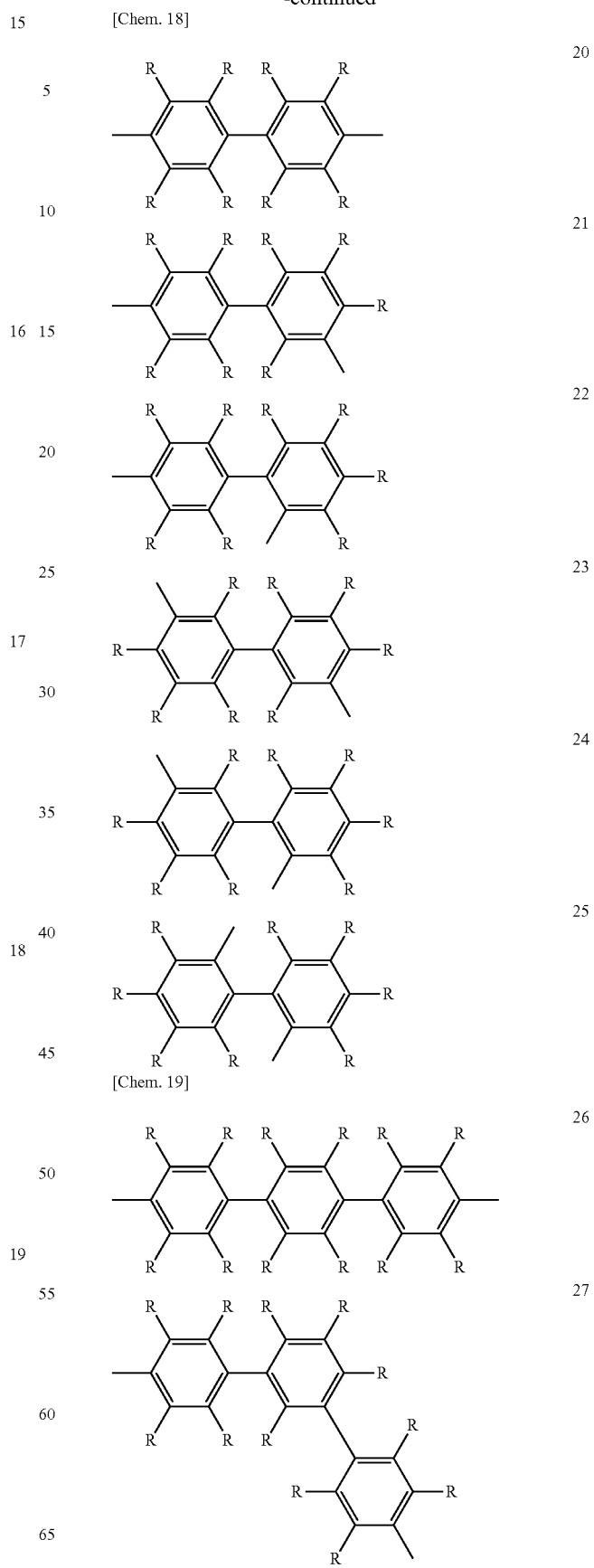

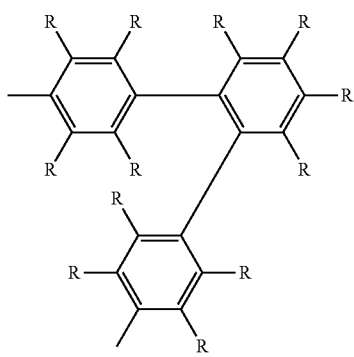
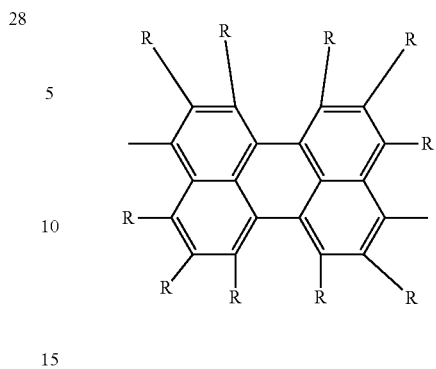
[Chem. 20]
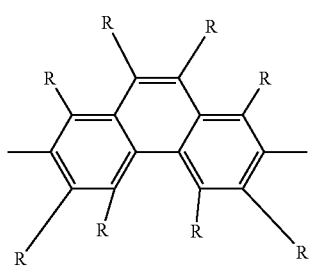
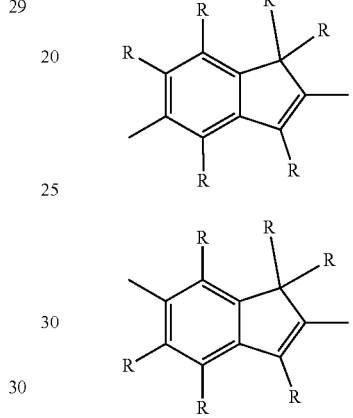
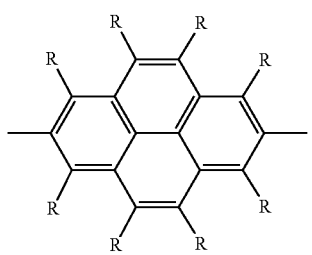
[Chem. 21]
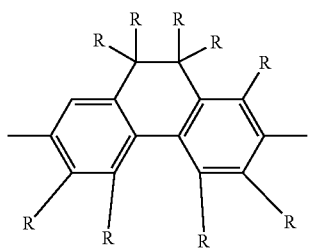
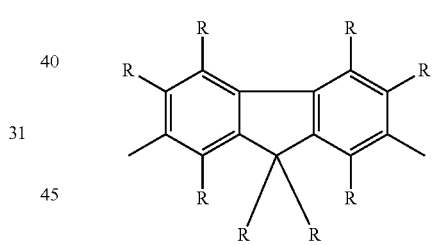
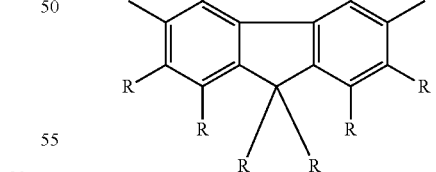
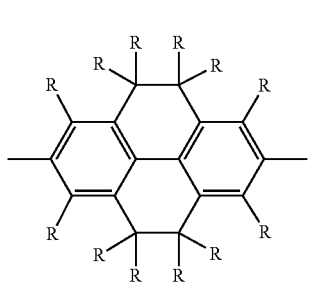
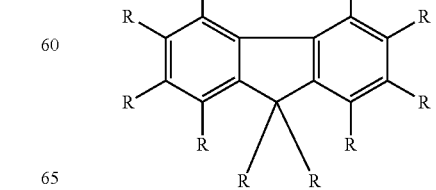

-continued

[Chem. 22]

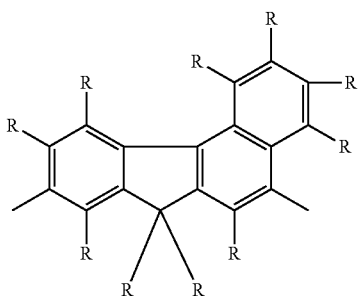
39

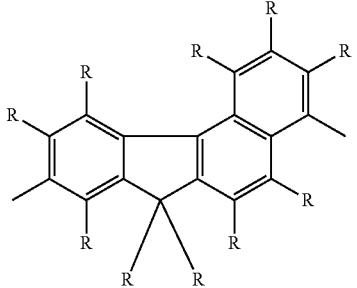
40

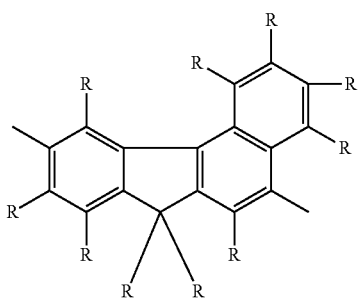
41

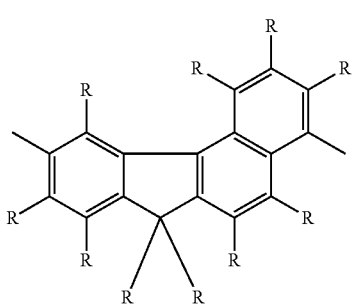
42

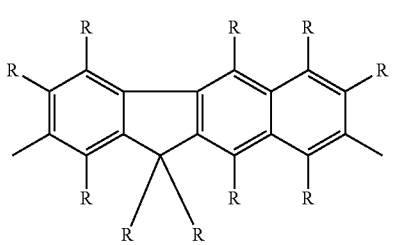
43

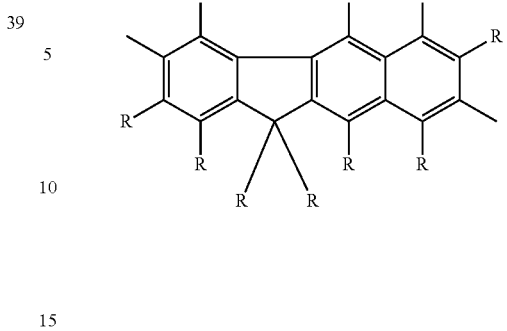
44

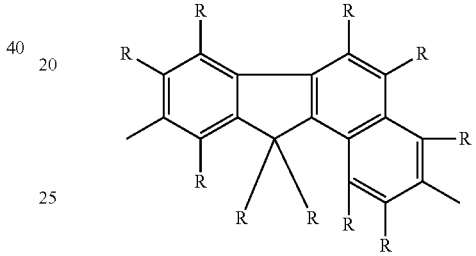
45

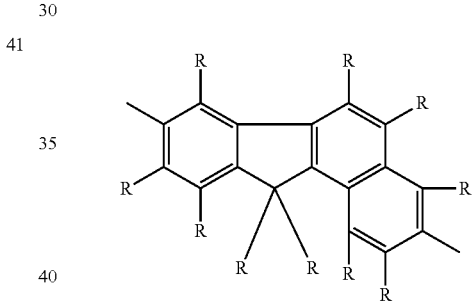
46

The structural unit constituting the polymer compound being the p-type semiconductor material may be a structural unit in which two or more types of structural units are connected in combination, the two or more types of structural units being selected from the group consisting of the structural unit represented by formula (I), the structural unit represented by formula (II), and the structural unit represented by formula (III).

If the polymer compound being the p-type semiconductor material include the structural unit represented by formula (I) and/or the structural unit represented by formula (II), a sum of the structural unit represented by formula (I) and the structural unit represented by formula (II) is generally in a range of 20 mol % to 100 mol %, where a total amount of all structural units contained in the polymer compound is 100 mol %. For the sake of better electron transport property as a p-type semiconductor material, the sum of the structural unit represented by formula (I) and the structural unit represented by formula (II) may be preferably in a range of 40 mol % to 100 mol %, or more preferably in a range of 50 mol % to 100 mol %.

The concrete examples of the polymer compound being the p-type semiconductor material include polymer compounds represented by the following formulae P-1 and P-2.

[Chem. 23]

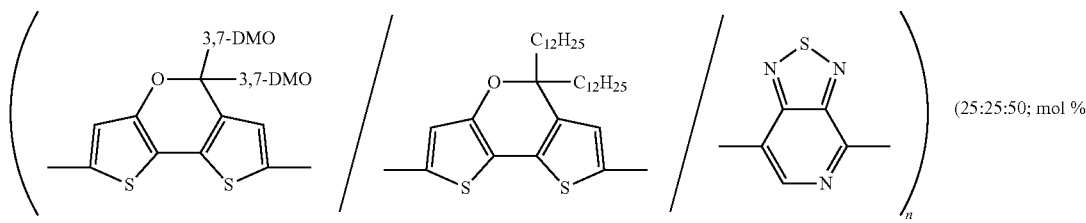

P-1

(25:25:50; mol %)

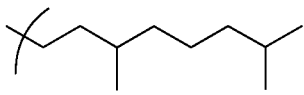

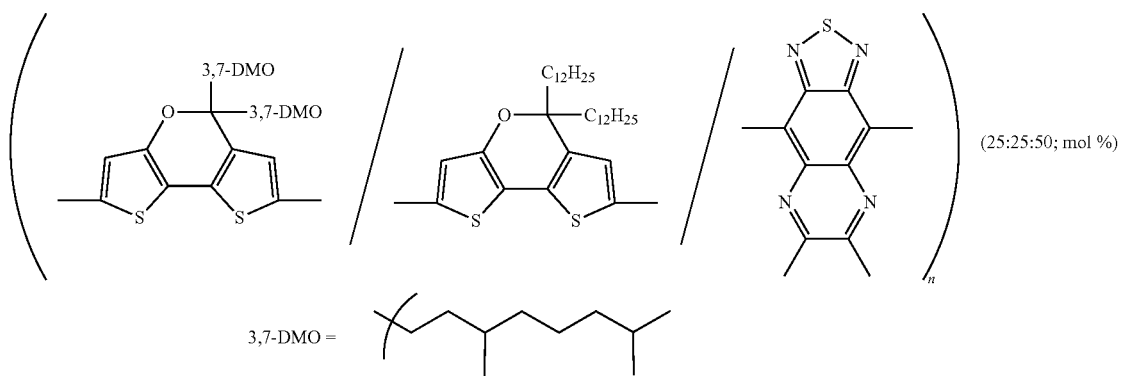

P-2

(25:25:50; mol %)

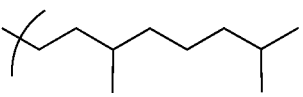

The active layer may include only one kind of the p-type semiconductor material or two or more types of the p-type semiconductor materials in combination at an arbitrary ratio.

In case where the active layer includes two or more types of the p-type semiconductor materials, it is only required that at least one kind of the p-type semiconductor materials be a polymer compound whose absorption peak wavelength is 900 nm or higher. In case where the active layer includes two or more types of the p-type semiconductor materials, it is preferable that each one of the p-type semiconductor materials be a polymer compound whose absorption peak wavelength is 900 nm or higher.

(n-Type Semiconductor Material)

According to the present embodiment, the energy gap between the LUMO of the n-type semiconductor material contained in the active layer and the HOMO of the hole transport material contained in the hole transport layer is less than 0.9 eV. For the sake of securing an energy gradient for attaining efficient transportation of the holes to the anode and efficient transportation of the electrons to the cathode, the energy gap may be preferably in a range of 0.3 eV to 0.8 eV, and especially for the sake of availability of the raw materials, the energy gap may be preferably in a range of 0.5 eV to 0.8 eV.

The active layer may include only one kind of the n-type semiconductor material or two or more types of the n-type semiconductor materials in combination at an arbitrary ratio.

What is meant by the "LUMO of the n-type semiconductor material" is, in case where the active layer includes only one kind of n-type semiconductor material, a value of the LUMO of the n-type semiconductor material or a value of the LUMO of the layer formed from the n-type semiconductor material, these values being measured by conventional and well-known means selected arbitrarily and appropriately, such as spectrophotometer. In case where the active layer includes two or more kinds of n-type semiconductor materials, what is meant by the "LUMO of the n-type semiconductor material" is a value of the LUMO of the layer formed from a mixture of the two or more kinds of n-type semiconductor materials, the value being measured by conventional and well-known means selected arbitrarily and appropriately, such as spectrophotometer.

For the sake of securing an energy gradient sufficient for electron transportation from the LUMO of the p-type semiconductor material to the LUMO of the n-type semiconductor material, the n-type semiconductor material may be preferably such that the value of the LUMO of the n-type semiconductor material be smaller than the value of an LUMO of the p-type semiconductor material by 0.2 (eV) or more.

The n-type semiconductor material may be a low-molecular weight compound or a high-molecular weight compound.

Examples of the n-type semiconductor material (electron acceptor compound) being a low-molecular weight compound include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, fullerenes and derivatives thereof such as $C_{60}$ fullerene, and phenanthrene derivatives such as bathocuproine.

Examples of the n-type semiconductor material (electron acceptor compound) being a high-molecular weight compound include polyvinyl carbazole and derivatives thereof, polysilane and derivatives thereof, polysiloxane derivatives having an aromatic amine structure in their side chain or main chain, polyaniline and derivatives thereof, polythiophene and derivatives thereof, polypyrrole and derivatives thereof, polyphenylene vinylene and derivatives thereof, and polythienylene vinylene and derivatives thereof, polyquinoline and derivatives thereof, polyquinoxaline and derivatives thereof, polyfluorene and derivatives thereof, and the like.

The n-type semiconductor material may be preferably one or more types selected from the group consisting of fullerene and fullerene derivatives, or may be more preferably a fullerene derivative(s).

Examples of fullerene include $C_{60}$ fullerene, $C_{70}$ fullerene, $C_{76}$ fullerene, $C_{78}$ fullerene, and $C_{84}$ fullerene. Examples of the fullerene derivatives include fullerene derivatives of these fullerenes. What is meant by fullerene derivatives is compounds that are at least partially modified fullerenes.

Examples of the fullerene derivatives include one or more compounds selected from the group consisting of compounds represented by the following formulae (N-a) to (N-f). The fullerene derivatives used in the present embodiment may be preferably the compound represented by the following formula (N-a), the compound represented by the following formula (N-b), the compound represented by the following formula (N-e), or the compound represented by the following formula (N-f), and for the sake of availability, may be more preferably the compound represented by the following formula (N-a), the compound represented by the following formula (N-c), or the compound represented by the following formula (N-e).

[Chem. 24]

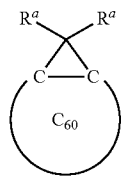
(N-a)

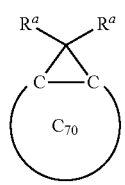
(N-b)

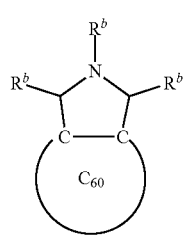
(N-c)

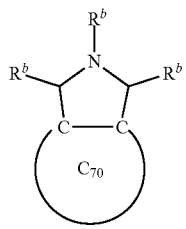
(N-d)

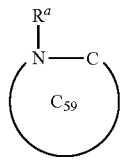
(N-e)

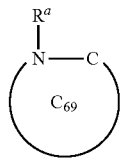
(N-f)

In the formulae (N-a) to (N-f), $R^a$ is an alkyl group, an aryl group, a monovalent heterocyclic group, or a group having an ester structure. where if there are a plurality of $R^a$ in the formula, the plurality of $R^a$ may be identical with or different from one another, and $R^b$ is an alkyl group or an aryl group, where the plurality of $R^b$ may be identical with or different from one another.

Examples of the group having an ester structure represented by $R^a$ include a group represented by the following formula (19).

[Chem. 25]

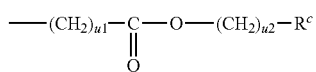
(19)

In the formula (19), u1 is an integer in a range of 1 to 6, u2 is an integer in a range of 0 to 6, and $R^c$ is an alkyl group, an aryl group, or a monovalent heterocyclic group.

Examples of $C_{60}$ fullerene derivatives include the following compounds.

[Chem. 26]

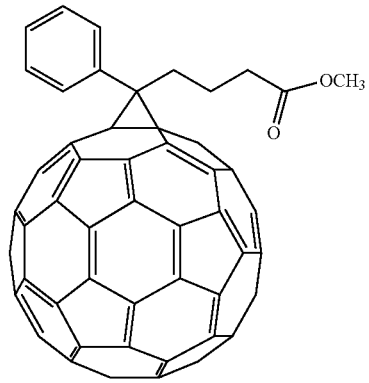

-continued
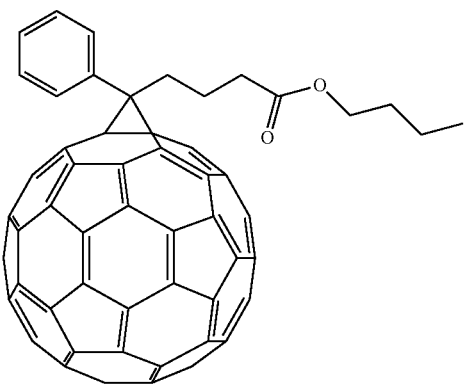
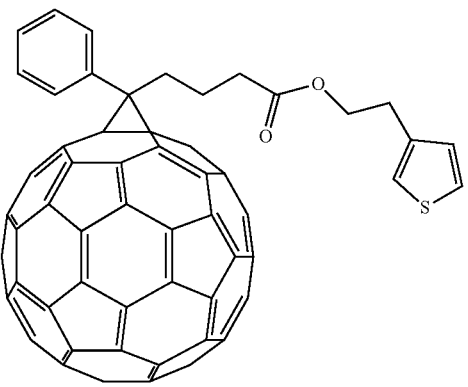
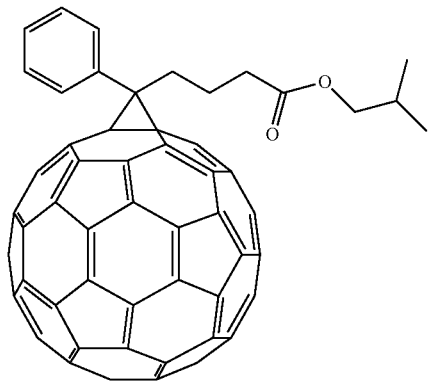
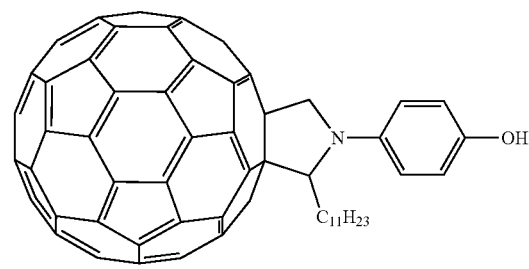
Examples of $C_{70}$ fullerene derivatives include the following compounds.
[Chem. 27]
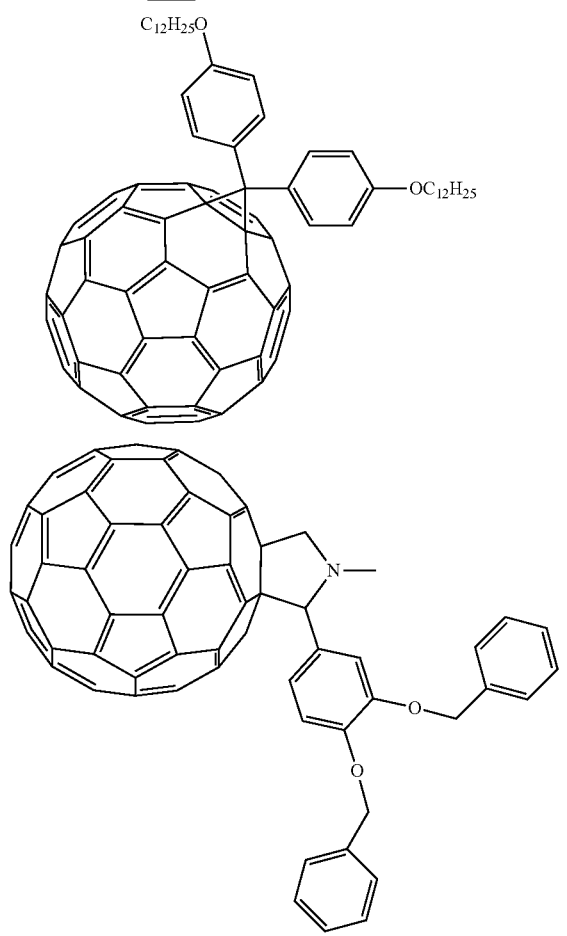
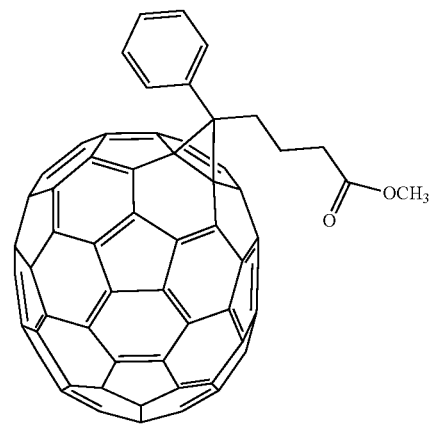
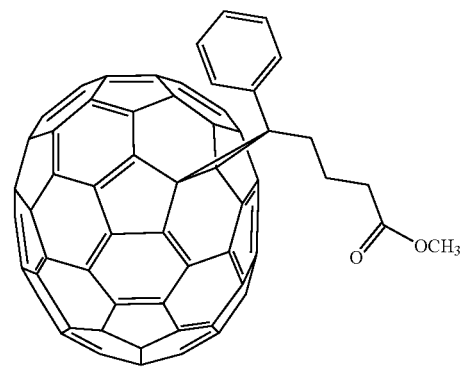

-continued

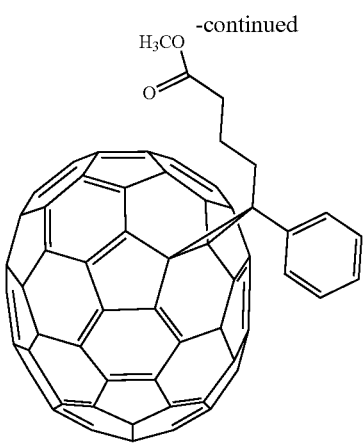

Concrete examples of the fullerene derivatives include [6,6]-phenyl-$C_{61}$ butyric acid methyl ester ($C_{60}$PCBM, [6,6]-phenyl-$C_{61}$ butyric acid methyl ester), [6,6]-phenyl $C_{71}$ butyric acid methyl ester ($C_{70}$PCBM, [6,6]-phenyl-$C_{71}$ butyric acid methyl ester), [6,6]-phenyl-$C_{85}$ butyric acid methyl ester ($C_{84}$PCBM, [6,6]-phenyl $C_{85}$ butyric acid methyl ester), and [6,6]-Thienyl $C_{61}$ butyric acid methyl ester ([6,6]-Thienyl $C_{61}$ butyric acid methyl ester).

According to the present embodiment, examples of suitable fullerene derivatives include compounds represented by the following formulae N-1 and N-2 (KLOC-6 and $C_{60}$PCBM).

[Chem. 28]

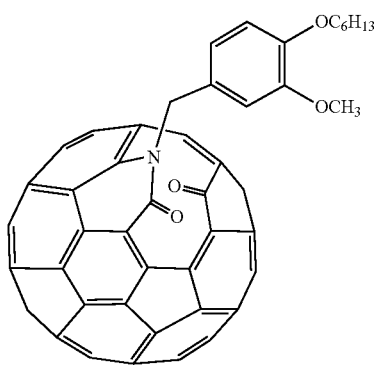

N-1

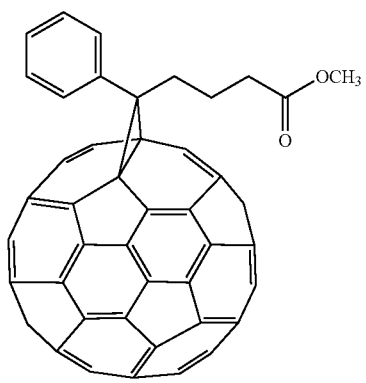

N-2

(Intermediate Layer)

As illustrated in FIG. 1, the photoelectric conversion element may preferably include an additional intermediate layer such as a charge transport layer (an electron transport layer, a hole transport layer, an electron injection layer, a hole injection layer) as a constituent element for providing a better property.

A material of the intermediate layer may be a conventional and well-known material selected arbitrarily and appropriately. Examples of the material of the intermediate layer include halides and oxides of alkali metals or alkali earth metals such as lithium fluoride.

Moreover, example of the material of the intermediate layer include fine particles of inorganic semiconductor materials such as titanium oxide, and a mixture of PEDOT (poly(3,4-ethylenedioxythiophene)) and PSS (poly(4-styrenesulfonate)) (PEDOT:PSS).

As illustrated in FIG. 1, the photoelectric conversion element according to the present embodiment includes the hole transport layer between the anode and the active layer. The hole transport layer has a function of transporting the holes from the active layer to the electrode.

The hole transport layer provided in contact with the anode may be referred to as a hole injection layer, especially. The hole transport layer (hole injection layer) provided in contact with the anode has a function of injecting the holes into the anode. The hole transport layer (hole injection layer) may be in contact with the active layer.

The hole transport layer includes the hole transport material. The present embodiment is so configured that the hole transport material is selected to attain the energy gap of less than 0.9 eV between the LUMO of the n-type semiconductor material contained in the active layer and the HOMO of the hole transport material contained in the hole transport layer. That is, the hole transport material may be selected in consideration of the LUMO of the n-type semiconductor material used as the material of the active layer.

In case where two or more hole transport layers are provided, what is only required is that at least one of the two or more hole transport layers is selected to attain the energy gap of less than 0.9 eV between the LUMO of the n-type semiconductor material contained in the active layer and the HOMO of the hole transport material contained in the hole transport layer.

It is preferable that the hole transport material used have a value of the HOMO in a range of −4.0 eV to −6.0 eV for example, because it is considered as preferable that the value of the HOMO of the hole transport material is similar to that of the HOMO of the p-type semiconductor material used as the material of the active layer.

Examples of the hole transport material include polythiophene and derivatives thereof such as PEDOT (PEDOT:PSS), aromatic amine compounds, polymer compounds including a structural unit including an aromatic amine residue, CuSCN, CuI, NiO, $WO_3$ and $MoO_3$.

In the present embodiment, the hole transport material may be, for example, PEDOT:PSS whose value of the HOMO is adjusted with an arbitrary and appropriate dopant or the like. Examples of such a hole transport material include HTL-Solar (HOMO: −4.87 eV, Heraeus K.K.), HTL-Solar N (HOMO: −4.90 eV, Heraeus K.K.), and AI4083 (HOMO: −5.20 eV, Heraeus K.K.).

In case where the hole transport layer includes only one kind of hole transport material, what is meant by the "HOMO of the hole transport material" is a value of the HOMO of the hole transport material or a value of the HOMO of a layer formed from the hole transport material, the value being measured by conventional and well-known means selected arbitrarily and appropriately, such as photoelectron spectroscopy. In case where the hole transport layer includes two or more kinds of hole transport materials, what is meant by the "HOMO of the hole transport material" is a value of a layer of a mixture of the two or more kinds of hole transport materials, the value being measured by conventional and well-known means selected arbitrarily and appropriately, such as photoelectron spectroscopy.

In the present embodiment, examples of combinations of the n-type semiconductor material and the hole transport material, which can attain the energy gap of less than 0.9 eV between the LUMO of the n-type semiconductor material contained in the active layer and the HOMO of the hole transport material contained in the hole transport layer include a combination of $C_{60}$PCBM and HTL-Solar, and a combination of KLOC-6 and AI4083.

As illustrated in FIG. 1, the photoelectric conversion element may include an electron transport layer between the cathode and the active layer. The electron transport layer has a function of transporting electrons from the active layer to the cathode. The electron transport layer may be in contact with the cathode. The electron transport layer may be in contact with the active layer. The electron transport layer in contact with the cathode may be referred to as electron injection layer, especially.

The electron transport layer includes an electron transport material. Examples of the electron transport material include nano particles of zinc oxide, nano particles of gallium-doped zinc oxide, nano particles of aluminum-doped zinc oxide, polyethyleneimine, ethoxylated polyethyleneimine (PEIE), and PFN-P2.

The intermediate layer may be formed by a coating method similar to a manufacturing method of the active layer described later.

(Sealing Member)

The photoelectric conversion element may be sealed with a sealing member. For example, the sealing member may be provided on a side on which the distal one of the electrodes with respect to the support substrate is positioned. Examples of the sealing member include a combination of a sealing substrate and a sealing material.

The sealing member may be a sealing layer having a layer structure including one or more layers. The sealing layer can be formed from a material having a water-blocking property (moisture barrier property) or an oxygen-blocking property (oxygen barrier property).

(Applications of Photoelectric Conversion Element)

The photoelectric conversion element according to the present embodiment is capable of flowing a photocurrent when light is radiated thereon from above the transparent or translucent electrode while a voltage (reverse bias voltage) is being applied between the electrodes, thereby being operable as a light detecting element (light sensor). Moreover, a plurality of such light sensors integrated together can be used as an image sensor.

Moreover, the photoelectric conversion element according to the present embodiment is capable of generating a photovoltaic power between the electrodes, thereby being operable as a solar cell. A plurality of such solar cells integrated together can form a solar cell module.

(Application Examples of Photoelectric Conversion Element)

The photoelectric conversion element according to the present embodiment of the present invention as described above are suitably applicable to detecting sections provided to various electronic devices such as work stations, personal computers, portable information terminals, room entry-exit management systems, digital cameras, and medical devices.

The photoelectric conversion element (light detecting element) of the present invention is suitably applicable to detecting sections provided on the electronic devices exemplified above, such as image detecting sections (image sensor) of solid-state image capturing devices such as X-ray image capturing devices and CMOS image sensors, detecting sections for detecting a certain feature of a living body such as a fingerprint detecting section, a face detecting section, a vein detecting section, and an iris detecting section, and detecting sections of optical bio sensors such as pulse oxymeters.

In the following, among the detecting sections to which the photoelectric conversion element according to the present embodiment of the present invention is suitably applicable, configuration examples of the image detecting section of the solid-state image capturing device and the fingerprint detecting section for a biometric authentication device (fingerprint authentication device) will be described, referring to drawings.

(Image Detecting Section)

Figure 2:
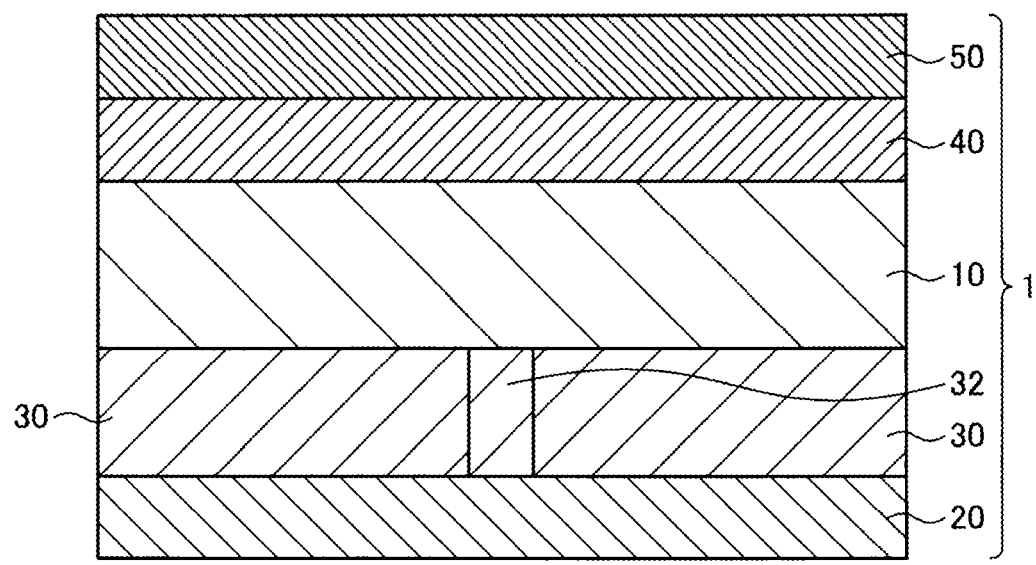
FIG. 2 is a view schematically illustrating a configuration example of an image detecting section.

FIG. 2 is a view schematically illustrating a configuration example of an image detecting section of a solid-state image capturing device.

An image detecting section 1 includes a CMOS transistor substrate 20, an interlayer insulating film 30 provided to cover the CMOS transistor substrate 20, a photoelectric conversion element 10 according to the present embodiment of the present invention provided on the interlayer insulating film 30, an interlayer wiring section 32 provided through the interlayer insulating film 30 and configured to electrically connecting the CMOS transistor substrate 20 and the photoelectric conversion element 10, a sealing layer 40 provided to cover the photoelectric conversion element 10, and a color filter 50 provided on the sealing layer 40.

The CMOS transistor substrate 20 has a conventional and well-known structure selected arbitrarily and appropriately and configured in a manner that is in conformity with a design of the image detecting section 1.

The CMOS transistor substrate 20 includes transistors, capacitors, and the like formed within a thickness of the substrate, and functional elements such as CMOS transistor circuits (MOS transistor circuits) for realizing various functions.

Examples of the functional elements include floating diffusion, reset transistors, output transistors, and selecting transistors.

The CMOS transistor substrate 20 is configured such that a signal reading circuit and the other circuits are formed with these functional elements, wirings, and the like.

The interlayer insulating film 30 may be formed with a conventional and well-known insulating material selected arbitrarily and appropriately, such as silicon oxide, and insulating resin. The interlayer wiring section 32 may be formed from a conventional and well-known electrically conductive material (wiring material) selected arbitrarily and appropriately such as copper or tungsten. The interlayer wiring section 32 may be, for example, an in-hole wiring formed at the same time as the formation of a wiring layer, or an embedded plug formed not at the same time as the formation of a wiring layer.

The sealing layer 40 may be formed from any conventional and well-known material selected arbitrarily and appropriately, provided that the material can prevent or reduce penetration of harmful materials such as oxygen and water, which would possibly deteriorate the photoelectric conversion element 10 functionally. The sealing layer 40 may be configured in a manner similar to the sealing member 17 described above.

The color filter 50 may be, for example, a primary color filter formed from any conventional and well-known material selected arbitrarily and appropriately, and configured as an aspect in conformity with the design of the image detecting section 1. Moreover, the color filter 50 may be a complementary color filter that can be thinner than such a primary color filter. The complementary color filter may be a color filter having, for example, a combination of three colors of yellow, cyan, and magenta, a combination of three colors of yellow, cyan, and transparent, a combination of three colors of yellow, transparent, and magenta, and a combination of three colors of transparent, cyan, and magenta. These can be positioned arbitrarily and appropriately according to the design of the photoelectric conversion element 10 and CMOS transistor substrate 20, provided that color image data can be generated.

The photoelectric conversion element 10 receives light via the color filter 50, converts the light into an electric signal according to a light amount of the light thus received, and outputs the electric signal via an electrode to outside of the photoelectric conversion element 10 as a received light signal, which is, an electric signal corresponding to a target object of image capturing.

Next, the received light signal outputted from the photoelectric conversion element 10 is inputted into the CMOS transistor substrate 20 via the interlayer wiring section 32, read out by a signal reading circuit fabricated on the CMOS transistor substrate 20, and subjected to a signal process by a conventional and well-known functional section (not illustrated) arbitrarily and appropriately selected, thereby to generate image information on the basis of the target object of image capturing.

(Fingerprint Detecting Section)

Figure 3:
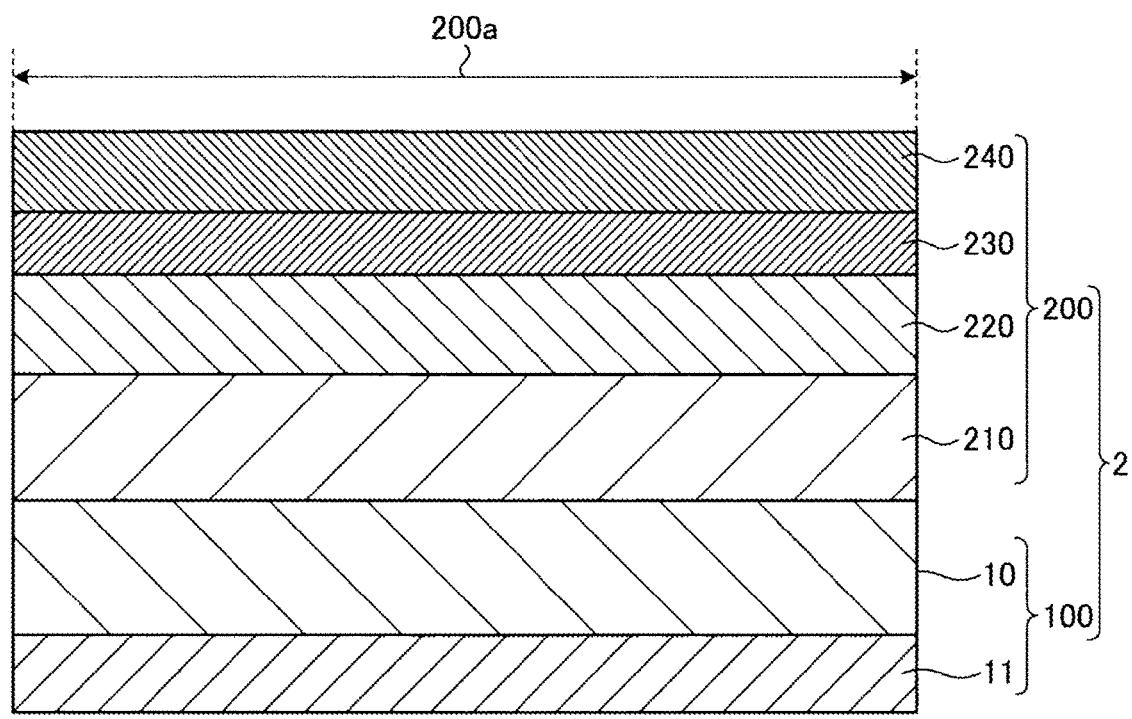
FIG. 3 is a view schematically illustrating a configuration example of a fingerprint detecting section.

FIG. 3 is a view schematically illustrating a configuration example of a fingerprint detecting section integrated with a display device.

A display device 2 of a portable information terminal includes a fingerprint detecting section 100 including a photoelectric conversion element 10 according to the present embodiment of the present invention as a main constituent element thereof, and a display panel section 200 provided on the fingerprint detecting section 100 and configured to display a predetermined image.

In this configuration example, the fingerprint detecting section 100 is provided in a region substantially matching with a display region 200*a* of the display panel section 200. That is, the display panel section 200 is laminated on the fingerprint detecting section 100 integrally.

In case where fingerprint detection is performed only in a partial region of the display region 200*a*, the fingerprint detecting section 100 may be provided only in the partial region.

The fingerprint detecting section 100 may include the photoelectric conversion element 10 according to the present embodiment of the present invention as a functional section configured to perform a main function of fingerprint detecting section 100. The fingerprint detecting section 100 may include any conventional and well-known member selected arbitrarily and appropriately such as a protection film (not illustrated), a support substrate, a sealing substrate, a sealing member, a barrier film, a band pass filter, or an infrared ray cut-off film, in a manner configured according to such a design to attain a desired property. The fingerprint detecting section 100 may employ the configuration of the image detecting section described above.

The photoelectric conversion element 10 may be included in an arbitrary manner in the display region 200*a*. For example, a plurality of the photoelectric conversion elements 10 may be provided in matrix.

The photoelectric conversion element 10 is provided on the support substrate 11 as described above. On the support substrate 11, for example, an electrode (anode or cathode) is provided in matrix.

The photoelectric conversion element 10 receives light, converts the light into an electric signal according to a light amount of the light thus received, and outputs the electric signal via an electrode to outside of the photoelectric conversion element 10 as a received light signal, which is, an electric signal corresponding to a fingerprint image captured.

In this configuration example, the display panel section 200 is configured as an organic electroluminescence display panel (organic EL display panel) including a touch sensor panel. The display panel section 200 may be configured, for example, as any conventional and well-known display panel selected arbitrarily and appropriately such as a liquid crystal display panel having a light source such as a backlight, instead of the organic EL display panel.

The display panel section 200 is provided on the fingerprint detecting section 100 described above. The display panel section 200 includes an organic electroluminescence element (organic EL element) 220 as a functional section for performing a main function. The display panel section 200 may further include any conventional and well-known member selected arbitrarily and appropriately such as a substrate such as a conventional and well-known glass substrate selected arbitrarily and appropriately (a support substrate 210 or a sealing substrate 240), a sealing member, a barrier film, a polarizer such as a circular polarizer, or a touch sensor panel 230, in a manner configured in conformity with a desired property.

In the configuration example described above, the organic EL element 220 is used as a light source for pixels in the display region 200*a* and as a light source for capturing an image of a fingerprint by the fingerprint detecting section 100.

Here, an operation of the fingerprint detecting section 100 will be briefly described. In performing fingerprint authentication, the fingerprint detecting section 100 detects a fingerprint by using light emitted from the organic EL element 220 of the display panel section 200. More specifically, the light emitted from the organic EL element 220 passes intermediate constituent elements provided between the organic EL element 220 and the photoelectric conversion element 10 of the fingerprint detecting section 100, and is reflected on a skin (finger surface) of a fingertip of a hand finger placed in contact with a surface of the display panel section 200 in the display region 200*a*. At least part of the light reflected on the finger surface passes the intermediate constituent elements, and is received by the photoelectric conversion element 10 and converted into electric signals by the photoelectric conversion element 10 according to amounts of received light received by the photoelectric conversion element 10. Then, from the electric signals thus converted, image information of the fingerprint on the finger surface is formed.

The portable information terminal provided with the display device 2 performs fingerprint authentication by comparing the image information thus obtained with prerecorded fingerprint data for the fingerprint authentication, by performing conventional and well-known steps selected arbitrarily and appropriately.

According to the photoelectric conversion element according to the present embodiment, it is possible to provide a photoelectric conversion element suitable as a light detecting element, in which the dark current is more effectively reduced, the SN ratio is improved, and consequently detection capability is improved.

The "SN ratio" is a parameter corresponding to a ratio of bright current under radiation of predetermined quasi-solar light (1 SUN) and dark current not under such radiation (in dark). Here, an evaluation method of the "SN ratio" will be described.

To begin with, current density-voltage characteristics of the photoelectric conversion element manufactured are measured in dark and under the radiation of quasi-solar light by using a conventional and well-known solar simulator selected arbitrarily and appropriately, thereby obtaining measurement values.

Next, with the measurement values thus obtained and a calculation equation described by the following formula, an SN ratio under 0V voltage application.

$$SN\ ratio = J_{sc}/J_d \quad \text{Formula:}$$

In the formula, $J_{sc}$ is a current density under 1SUN radiation under 0V voltage application, and $J_d$ is a current density in dark under 0V voltage application.

By performing these steps, it is possible to calculate out the SN ratio of the photoelectric conversion element manufactured.

2. Manufacturing Method of Photoelectric Conversion Element

A manufacturing method of the photoelectric conversion element according to the present embodiment is not particularly limited. The photoelectric conversion element may be manufactured by a combination of forming methods suitable for the materials selected for forming the constituent elements.

The active layer, which is a main constituent of the photoelectric conversion element according to the present embodiment, is a bulk heterojunction type, and therefore can be manufactured by a coating method using a coating liquid (ink).

The manufacturing method of a photoelectric conversion element is a manufacturing method of a photoelectric conversion element, including an anode, a cathode, an active layer provided between the anode and the cathode, and a hole transport layer provided between the anode and the active layer, in which the active layer includes a p-type semiconductor material, which is a polymer compound having an absorption peak wavelength of 900 nm or higher, and an n-type semiconductor material, and an energy gap between an LUMO of the n-type semiconductor material contained in the active layer and a HOMO of a hole transport material contained in the hole transport layer is less than 0.9 eV.

In the manufacturing method, it is preferable to form the active layer and the hole transport layer by such a coating method using a coating liquid. In the following, the manufacturing method of the photoelectric conversion element according to the present embodiment will be described in more detail.

(Step of Preparing a Substrate)

In this step, a support substrate on which an anode is provided is prepared. A method of providing the anode on the support substrate is not particularly limited. The anode may be formed on the support substrate, for example, by coating a material exemplified as the material of the electrode by a vacuum deposition method, a sputtering method, an ion plating method, a plating method, or the like, the support substrate being made from a material described above.

Moreover, the support substrate on which the anode is provided can be prepared by obtaining a commercially-available substrate with an electrically conductive thin film thereof formed from a material of the electrode described above, and if necessary, fabricating the anode by patterning the electrically conductive thin film.

(Step of Forming the Hole Transport Layer) In the present embodiment, the hole transport layer is formed on the anode. A forming method of the hole transport layer is not particularly limited. For the sake of further simplifying the step of forming the hole transport layer, it is preferable that the hole transport layer be formed by a coating method. For example, the hole transport layer may be formed by coating a coating liquid containing the above-described hole transport material and a solvent on the layer on which the hole transport layer is to be formed.

The hole transport material for the hole transport layer of the photoelectric conversion element according to the present embodiment is selected to attain the energy gap of less than 0.9 eV between the LUMO of the n-type semiconductor material used as the material of the active layer and the HOMO of the hole transport material contained in the hole transport layer. In the other words, the hole transport material is selected in consideration of the LUMO of the n-type semiconductor material used as the material of the active layer.

Examples of the solvent constituting the coating liquid for use in the coating method for forming the hole transport layer include water, alcohols, ketones, hydrocarbons, and the like. Concrete examples of the alcohols include methanol, ethanol, isopropanol, butanol, ethylene glycol, propylene glycol, butoxy ethanol, and methoxy butanol, and the like. Concrete examples of ketones include acetone, methyl ethyl ketone, methyl isobutyl ketone, 2-heptanone, and cyclohexanone, and the like. Concrete examples of the hydrocarbons include n-pentane, cyclohexane, n-hexane, benzene, toluene, xylene, tetralin, chlorobenzene, and o-dichlorobenzene, and the like. The coating liquid may include only one type of solvent or two or more types of solvents, and may include two or more types of the solvents mentioned above. An amount of the solvent(s) in the coating liquid is preferably not less than 1 part by weight but not more than 10000 parts by weight, or more preferably not less than 10 parts by weight but not more than 1000 parts by weight, with respect to 1 part by weight of the material of the hole transport layer.

Examples of a method of applying the coating liquid containing the material of the hole transport layer and the solvent (coating method) include a spin coating method, a casting method, a microgravure coating method, a gravure coating method, a bar coating method, a roll coating method, a wire bar coating method, a dip coating method, a spray coating method, a screen printing method, flexo printing method, an offset printing method, an inkjet printing method, a dispenser printing method, a nozzle coating method, a capillary coating method, and the like. Among these, the spin coating method, the flexo printing method, the inkjet printing method, and the dispenser printing method are preferable.

It is preferable that a coating film thus formed by coating the coating liquid containing the material of the hole transport layer and the solvent be subjected to a heat treatment, an air-drying treatment, reduced pressure treatment, or the like, thereby performing a step of removing the solvent therefrom.

(Step of Forming the Active Layer)

A step of forming the active layer includes (i) a step of forming the coated film by coating, on a coating target, the coating liquid containing the solvent, a p-type semiconductor material, which is a polymer compound having an absorption peak wavelength of 900 nm or higher, and the n-type semiconductor material selected to attain the energy gap of less than 0.9 eV between the LUMO of the n-type semiconductor material and the HOMO of the hole transport material contained in the hole transport layer, and (ii) a step of removing the solvent from the coated film.

In the following, the step (i) and the step (ii) included in the forming method of the active layer of the photoelectric conversion element of the present invention will be described.

Step (i) The method of coating the coating liquid on the coating target may be a coating method selected arbitrarily and appropriately. The coating method may be preferably a slit coating method, a knife coating method, a spin coating method, a microgravure coating method, a gravure coating method, a bar coating method, an inkjet printing method, a nozzle coating method, or a capillary coating method, more preferably the slit coating method, the spin coating method, the capillary coating method, or the bar coating method, or further preferably the slit coating method or the spin coating method.

The coating liquid for forming the active layer is applied on the coating target selected according to the photoelectric conversion element and the manufacturing method thereof. The process for manufacturing the photoelectric conversion element may be such that the coating liquid for forming the active layer may be applied on a functional layer which the photoelectric conversion element has and in which the active layer may exist. Thus, the coating target of the coating liquid for forming the active layer may vary depending on a layer configuration of layers of the photoelectric conversion element to be manufactured and the order of forming the layers. For example, in case where the photoelectric conversion element has a layer configuration of substrate/anode/hole transport layer/active layer/electron transport layer/cathode, and the layers are formed in the order of from the leftmost layer to the right most layer, the coating target of the coating liquid is the hole transport layer. Moreover, for example, in case where the photoelectric conversion element has a layer configuration of substrate/cathode/electron transport layer/active layer/hole transport layer/anode, and the layers are formed in the order of from the leftmost layer to the right most layer, the coating target of the coating liquid is the electron transport layer. In the present embodiment, the active layer is formed on the hole transport layer.

Step (ii) As a method of removing the solvent from the coated film of the coating liquid, that is, a method of converting the coating film into a solidified film by removing the solvent from the coated film may be any method as appropriate. Examples of the method of removing the solvent include drying methods such as a method of directly heating by using a hot plate, a hot-air drying method, an infrared ray heating drying method, a flush lamp annealing drying method, and a reduced pressure drying method.

The step of forming the active layer may further include a step other than the step (i) and the step (ii), as long as the other step will not act against the object and effect of the present invention.

The manufacturing method of the photoelectric conversion element may be a method of manufacturing a photoelectric conversion element including a plurality of active layers, and may include repeating the step (i) and the step (ii) plural times.

A thickness of the active layer can be adjusted by changing, for example, the amount of the solvent in the total amount of the ink in the step of forming the active layer. More specifically, for example, in order to adjust the thickness of the active layer to be thicker, the amount of the solvent in the coating liquid is reduced. In order to adjust the thickness of the active layer to be thinner, the amount of the solvent in the coating liquid is increased. In this way, the thickness of the active layer can be adjusted to an appropriate thickness.

Moreover, especially in case where the active layer is formed by the spin coating method, it is possible to adjust the thickness of the active layer as appropriate by changing a rotation speed (the number of revolutions per a predetermined time). More specifically, with a faster rotation speed, the thickness of the active layer can be adjusted to be thinner, while the thickness of the active layer can be adjusted to be thicker with a slower rotation speed.

(Coating Liquid)

The coating liquid may be a solution, or a dispersion liquid such as a dispersion, an emulsion (emulsion), or a suspension (suspension). The coating liquid according to the present embodiment is a coating liquid for forming the active layer, and includes the p-type semiconductor material, an n-type semiconductor material, and a first solvent, and may optionally include a second solvent as desired. In the following, the components of the coating liquid will be described.

The coating liquid may include only one kind of the n-type semiconductor material or two or more types of the n-type semiconductor materials in combination at an arbitrary ratio.

(Weight Ratio of p-Type Semiconductor Material and n-Type Semiconductor Material (p/n Ratio))

A weight ratio of the p-type semiconductor material and the n-type semiconductor material (p-type semiconductor material/n-type semiconductor material) may be preferably in a range of 9/1 to 1/9, more preferably in a range of 5/1 to 1/5, or especially preferably in a range of 3/1 to 1/3.

(First Solvent)

The solvent is selected in consideration of solubility for the p-type semiconductor material and the n-type semiconductor material thus selected, and properties (such as boiling point) for drying conditions for forming the active layer.

The first solvent may be preferably an aromatic hydrocarbon (hereinafter, referred to as simply the aromatic hydrocarbon) or a halogenated alkyl solvent, that may be substituted with a substituent(s) (such as an alkyl group(s) or a halogen atom(s)). The first solvent may be preferably selected in consideration of the solubility for the p-type semiconductor material and the n-type semiconductor material thus selected.

Examples of the aromatic hydrocarbon as the first solvent include toluene, xylene (for example, o-xylene, m-xylene, and p-xylene), trimethyl benzene (for example, mesitylene, 1,2,4-trimethylbenzene (pseudocumene)), butyl benzene (for example, n-butylbenzene, sec-butylbenzene, tert-butylbenzene, methyl naphthalene (for example, 1-methylnaphthalene), tetralin, indan, chlorobenzene, and dichlorobenzene (o-dichlorobenzene).

Examples of the halogenated alkyl solvent as the first solvent include chloroform.

The first solvent may include only one type of the aromatic hydrocarbon or may include two or more types of the aromatic hydrocarbons. It is preferable that the first solvent includes only one type of the aromatic hydrocarbon.

The first solvent may preferably include one or more types selected from the group consisting of toluene, o-xylene, m-xylene, p-xylene, mesitylene, pseudocumene, n-butylbenzene, sec-butylbenzene, tert-butylbenzene, methylnaphthalene, tetralin, indan, chlorobenzene, o-dichlorobenzene, and chloroform.

(Second Solvent)

It is preferable that the second solvent be a solvent selected especially for the sake of improving the solubility of the n-type semiconductor material, reducing the dark current, and improving the SN ratio. Examples of the second solvent include: ketone solvents such as acetone, methylethylketone, cyclohexanone, acetophenone, and propiophenone; ester solvents such as ethyl acetate, butyl acetate, phenyl acetate, ethyl cellosolve acetate, methyl benzoate, butyl benzoate, and benzyl benzoate; an aromatic hydrocarbon solvents such as o-dichlorobenzene.

(Weight Ratio of the First Solvent and the Second Solvent)

A weight ratio of the first solvent and the second solvent (first solvent/second solvent) is preferably in a range of 85/15 to 99/1, for the sake of further improving the solubility for the p-type semiconductor material and the n-type semiconductor material.

(Weight Percentage of the Sum of the First Solvent and the Second Solvent in the Coating Liquid)

A total weight of the first solvent and the second solvent in the coating liquid may be preferably 90 wt % or more, more preferably 92 wt % or more, or further preferably 95 wt % or more, where the total weight of the coating liquid is 100 wt %, for the sake of further improving the solubility for the p-type semiconductor material and the n-type semiconductor material, and may be preferably 99.9 wt % or less for the sake of making it easier to form a layer with a thickness equal to or thicker than a certain thickness by increasing the densities of the p-type semiconductor material and the n-type semiconductor material in the coating liquid.

(Optional Solvent)

The coating liquid may include an optional solvent other than the first solvent and the second solvent. A content ratio of the optional solvent may be preferably 5 wt % or less, more preferably 3 wt % or less, or further preferably 1 wt % or less, where the total weight of all the solvents in the coating liquid is 100 wt %. The optional solvent may be preferably a solvent with a boiling point higher than that of the second solvent.

(Optional Component)

The coating liquid may include an optional component such as an ultraviolet absorbing agent, an anti-oxidant, a sensitizer for giving a greater sensibility to the function of generating electric charge from the absorbed light, and a light stabilizer for increasing stability against ultraviolet rays, in addition to the first solvent, the second solvent, the p-type semiconductor material, and the n-type semiconductor material, as long as the optional component will not act against the object and effect of the present invention.

(Concentration of the p-Type Semiconductor Material, and the n-Type Semiconductor Material in the Coating Liquid)

A concentration of the sum of the p-type semiconductor material, and the n-type semiconductor material in the coating liquid may be any concentration as appropriate, according to the thickness of the active layer required. The concentration of the sum of the p-type semiconductor material and the n-type semiconductor material may be preferably not less than 0.01 wt % but not more than 20 wt %, more preferably not less than 0.01 wt % but not more than 10 wt %, further preferably not less than 0.01 wt % but not more than 5 wt %, and especially preferably not less than 0.1 wt % but not more than 5 wt %.

The p-type semiconductor material and the n-type semiconductor material may be dissolved or dispersed in the coating liquid. It is preferable that the p-type semiconductor material and the n-type semiconductor material be at least partially dissolved therein, and it is more preferable that the p-type semiconductor material and the n-type semiconductor material be wholly dissolved therein.

(Preparation of the Coating Liquid)

The coating liquid may be prepared by a conventional well-known method. For example, the coating liquid may be prepared by a method including mixing the first solvent and the second solvent together so as to prepare a mixture solvent, and adding the p-type semiconductor material and the n-type semiconductor material in the mixture solvent, a method including adding the p-type semiconductor material in the first solvent, adding the n-type semiconductor material in the second solvent, and mixing the first solvent and the second solvent together, in which the p-type semiconductor material and the n-type semiconductor material have been respectively added, or the like method.

The first solvent and the second solvent, and the p-type semiconductor material and the n-type semiconductor material may be mixed together after being heated up to a temperature equal to or lower than the boiling points of the solvents.

The coating liquid may be such that, after mixing the first solvent and the second solvent, and the p-type semiconductor material and the n-type semiconductor material together, a mixture thus obtained is filtered with a filter, and a filtrate thus obtained is used as the coating liquid. The filter may be, for example, a filter formed from a fluororesin such as polytetrafluoroethylene (PTFE).

(Step of Forming the Electron Transport Layer)

A manufacturing method of the photoelectric conversion element according to the present embodiment may include a step of forming an electron transport layer (electron injection layer) provided between the active layer and the cathode.

More specifically, the manufacturing method of the photoelectric conversion element according to the present embodiment further includes the step of forming the electron transport layer after the step of forming the active layer.

A method of forming the electron transport layer is not particularly limited. For the sake of further simplifying the step of forming the electron transport layer, it is preferable to form the electron transport layer by a coating method similar to that for the step of forming the active layer described above. That is, it is preferable that, after the formation of the active layer, the electron transport layer be formed by applying a coating liquid including the electron transport material and a solvent on the active layer, and if necessary, removing the solvent from the coating liquid thus applied, by performing drying treatment (heating treatment) or the like.

The electron transport material for forming the electron transport layer may be an organic compound or an inorganic compound.

The electron transport material being an organic compound may be a low-molecular weight organic compound or a high-molecular weight organic compound.

Examples of the electron transport material being a low-molecular weight organic compound include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes and derivatives thereof such as $C_{60}$ fullerene, and phenanthrene derivatives such as bathocuproine.

Examples of the electron transport material being a high-molecular weight organic compound include polyvinyl carbazole and derivatives thereof, polysilane and derivatives thereof, polysiloxane derivatives having an aromatic amine structure in their side chain or main chain, polyaniline and derivatives thereof, polythiophene and derivatives thereof, polypyrrole and derivatives thereof, polyphenylene vinylene and derivatives thereof, and polythienylene vinylene and derivatives thereof, polyfluorene and derivatives thereof, and the like.

Examples of the electron transport material being an inorganic compound include zinc oxide, titanium oxide, zirconium oxide, tin oxide, indium oxide, GZO (gallium-doped zinc oxide, ATO (antimony-doped tin oxide), and AZO (aluminum-doped zinc oxide). Among them, zinc oxide, gallium-doped zinc oxide, and aluminum doped-zinc oxide are preferable. In forming the electron transport layer, it is preferable that the electron transport layer be formed by using a coating liquid containing particles of zinc oxide, gallium-doped zinc oxide, or aluminum-doped zinc oxide. As such an electron transport material, it is preferable to use nano particles of zinc oxide, nano particles of gallium-doped zinc oxide, or nano particles of aluminum-doped zinc oxide. It is more preferable to form the electron transport layer from an electron transport material consisting of only the nano particles of zinc oxide, the nano particles of gallium-doped zinc oxide, or the nano particles of aluminum-doped zinc oxide.

An average particle size of the nano particles of zinc oxide, the nano particles of gallium-doped zinc oxide, or the nano particles of aluminum-doped zinc oxide as sphere equivalent diameter is preferably in a range of 1 nm to 1000 nm, or more preferably in a range of 10 nm to 100 nm. The average particle size can be measured, for example, by laser light scattering method, X-ray diffraction method, or the like.

Examples of the solvent included in the coating liquid including the electron transport material include water, alcohols, ketones, hydrocarbons, and the like. Concrete examples of the alcohols include methanol, ethanol, isopropanol, butanol, ethylene glycol, propylene glycol, butoxy ethanol, methoxy butanol, and the like. Concrete examples of ketones include acetone, methyl ethyl ketone, methyl isobutyl ketone, 2-heptanone, cyclohexanone, and the like. Concrete examples of the hydrocarbons include n-pentane, cyclohexane, n-hexane, benzene, toluene, xylene, tetralin, chlorobenzene, o-dichlorobenzene, and the like. The coating liquid may include only one type of solvent or two or more types of solvents, and may include two or more types of the solvents mentioned above.

The coating liquid for use in the coating method for forming the electron transport layer may be a dispersion such as an emulsion (emulsion), or a suspension (suspension). The coating liquid may be preferably a coating liquid that would not give a significant damage to the layer on which the coating liquid is applied (such as the active layer or the other layer), and more specifically, the coating liquid may be preferably a coating liquid that is difficult to dissolve the layer on which the coating liquid is applied (such as the active layer or the other layer).

(Step of Forming the Cathode)

In case where the method of forming the photoelectric conversion element according to the present invention includes the step of forming the electron transport layer, the cathode is formed on the electron transport layer.

A method of forming the cathode is not particularly limited. The cathode may be formed on the layer on which the cathode is to be formed (for example, the active layer or the electron transport layer), by applying the material of the cathode described above by a vacuum deposition method, a sputtering method, an ion plating method, a plating method, a coating method, or the like.

In case where the material of the cathode is polyaniline or a derivative thereof, polythiophene or a derivative thereof, nano particles of an electrically conductive material, nano wires of an electrically conductive material, or a nano tubes of an electrically conductive material, the cathode may be formed by a coating method with an emulsion (emulsion), a suspension (suspension) or the like containing such a material and a solvent.

Moreover, if the material of the cathode contains an electrically conductive material, the cathode may be formed by a coating method with a coating liquid, metal ink, a metal paste, a melted low-melting point metal, or the like containing the electrically conductive material. Examples of the coating method using the coating liquid containing the material of the cathode and the solvent include methods similar to these methods for the step of forming the active layer described above.

Examples of the solvent contained in the coating liquid for forming the cathode by the coating method include: hydrocarbon solvents such as toluene, xylene, mesitylene, tetralin, decalin, bicyclohexyl, n-butylbenzene, sec-butylbenzene, and tert-butylbenzene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; halogenated aromatic hydrocarbon solvents such as chlorobenzene, dichlorobenzene, and trichlorobenzene; ether solvents such as tetrahydrofurane and tetrahydropyrane; water; alcohols; and the like. Concrete examples of the alcohols include methanol, ethanol, isopropanol, butanol, ethylene glycol, propylene glycol, butoxy ethanol, methoxy butanol, and the like. The coating liquid may solely include one type of solvent may include two or more types of solvents, or may include two or more types of the solvents listed above.

EXAMPLES

In the followings, examples will be described in order to explain the present invention in more detail. It should be noted that the present invention is not limited to the examples described below.

(p-Type Semiconductor Material)

In the Examples, p-type semiconductor materials (electron donor compounds) being polymer compounds listed on Table 1 below were used.

TABLE 1
| Polymer compound | | Absorption peak Wavelength | Chemical structure |
|---|---|---|---|
| p-type semiconductor material | P-1 | 921 nm | 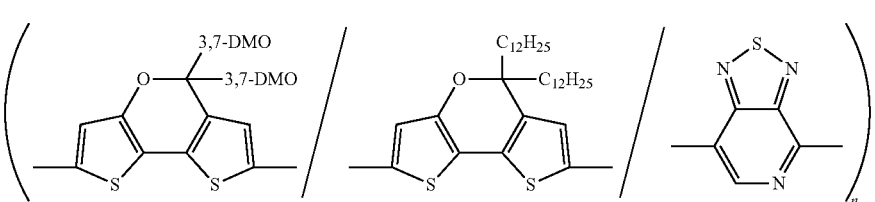 (25:25:50; mol %) <br> 3,7-DMO = |
| | P-2 | 1513 nm | 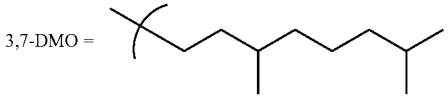 (25:25:50; mol %) <br> 3,7-DMO = |
| | P-3 | 801 nm | 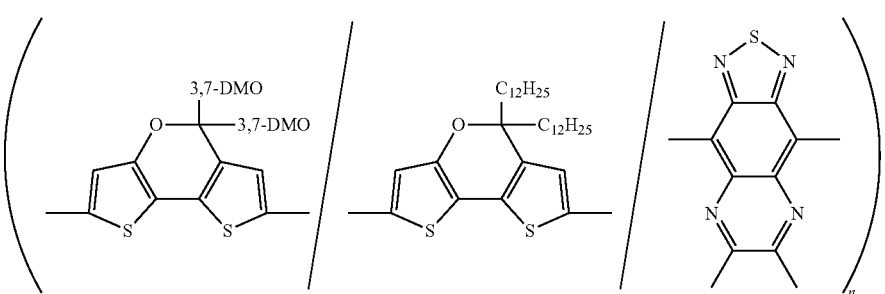 (25:25:50; mol %) <br> 3,7-DMO = |
| | P-4 | 512 nm | 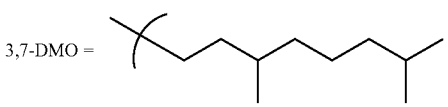 |

The polymer compound P-1, being a p-type semiconductor material, was synthesized according to the method described in International Publication No. 2011/052709, and used herein. The polymer compound P-2, being a p-type semiconductor material, was synthesized according to the method described in International Publication No. 2011/052709, and used herein. The polymer compound P-3, being a p-type semiconductor material, was synthesized according to the method described in International Publication No. 2013/051676, and used herein. The polymer compound P-4, being a p-type semiconductor material, was obtained by purchasing P3HT (Poly(3-hexylthiophene-2,5-diyl) (manufactured by Sigma-Aldrich Co. LLC.), and used herein.

Here, the measurement of the absorption peak wavelength was performed by using a spectrophotometer (ultraviolet visible near-infrared spectrophotometer) (JASCO-V670, manufactured by JASCO Corporation), which is operable for ultraviolet, visible, and near infrared wavelengths.

For the measurement of the absorption peak wavelengths, an absorption spectrum of a substrate used for the measurement was measured. The substrate was a glass substrate. Then, by applying on the glass substrate a solution containing a compound to be measured or a coating liquid being a melted form containing the compound, a thin film of 100 nm in thickness containing the compound to be measured was prepared.

After that, an absorption spectrum of a laminate of the thin film thus obtained and the substrate thus laminated was measured. A difference between the absorption spectrum of the laminate of the thin film and the substrate, and the absorption spectrum of the substrate was calculated out as an absorption spectrum of the thin film.

In the absorption spectrum of the thin film thus obtained, that is, an absorption spectrum graphed by plotting the absorption of the compound against the wavelengths where the absorption of the compound was the vertical axis and the wavelength was the horizontal axis, a value corresponding to a wavelength at which absorption peak of the highest absorption was obtained was taken as "absorption peak wavelength".

(n-Type Semiconductor Material)

In the Examples, n-type semiconductor materials (electron acceptor compounds) listed on Table 2 below were used.

TABLE 2

| | Compound | LUMO | Chemical structure |
|---|---|---|---|
| n-type semiconductor material | N-1 | −4.48eV | 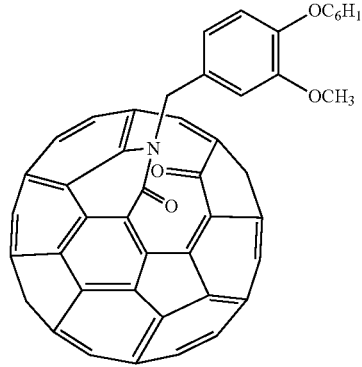<br>KLOC-6 |
| | N-2 | −4.30eV | 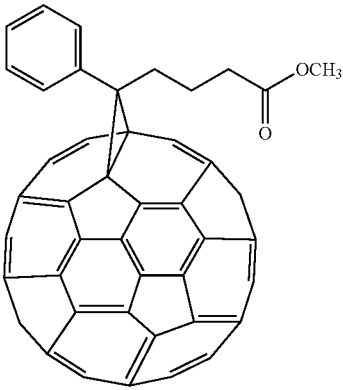<br>C$_{60}$PCBM |

TABLE 2-continued

| Compound | LUMO | Chemical structure |
|---|---|---|
| N-3 | −4.28eV | 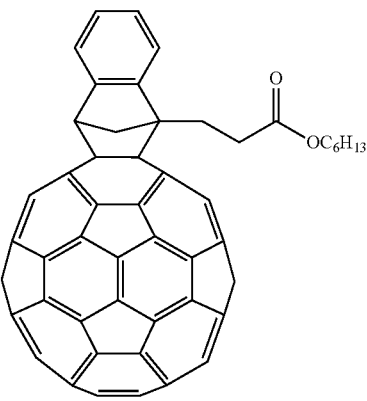 [60] IPH |

The compound N-1, being an n-type semiconductor material, was obtained by purchasing KLOC-6(Solenne-BV), and used herein. The compound N-2, being an n-type semiconductor material, was obtained by purchasing E100 (Frontier Carbon Corporation), and used herein. The compound N-3, being an n-type semiconductor material, was obtained by purchasing [60]IPH (Solenne-BV), and used herein.

Here, a method of measuring the value of the LUMO of the n-type semiconductor materials is explained. Note that, the value of the LUMO of the compound N-2 is available by literature or the like, and this literature value was used herein.

Calculation of the values of the LUMOs of the compounds N-1 and the compound N-3 was conducted by using the literature value of the LUMO of the compound N-2 and a cyclic voltammetry measuring device (Electrochemical Analyzer Model 600B, CH Instrumemts Inc.).

More specifically, respective cyclic voltammograms (current-voltage curves) of the compound N-1, the compound N-2, and the compound N-3 were obtained, and differences of the values of the LUMOs (LUMO difference) between these compounds were calculated out.

Next, from a difference of the literature value of the LUMO of the compound N-2 and the measured value of the LUMO of the compound N-2, the values of the LUMOs of the compound N-1 and the compound N-3 were calculated out.

(Hole Transport Materials)

In the Examples, hole transport materials listed on Table 3 below were used.

TABLE 3

| | Compound | HOMO | Product Name |
|---|---|---|---|
| Hole transport material | H-1 | −4.87 eV | HTL-Solar (Heraeus K.K.) |
| | H-2 | −4.90 eV | HTL-Solar N (Heraeus K.K.) |
| | H-3 | −4.90 eV | PH500N (Heraeus K.K.) |
| | H-4 | −5.20 eV | AI4083 (Heraeus K.K.) |
| | H-5 | −5.60 eV | Plexcore OC AQ-1100 (Plextronics, Inc.) |

The compound H-1, being a hole transport material, was obtained by purchasing HTL-Solar (Heraeus K.K.), and used herein. The compound H-2, being a hole transport material, was obtained by purchasing HTL-Solar N (Heraeus K.K.), and used herein. The compound H-3, being a hole transport material, was obtained by purchasing PH500N (Heraeus K.K.), and used herein. The compound H-4, being a hole transport material, was obtained by purchasing AI4083 (Heraeus K.K.), and used herein. The compound H-5, being a hole transport material, was obtained by purchasing Plexcore OC AQ-1100 (Plextronics, Inc.), and used herein.

Here, the measurement of the values of the HOMOs of the hole transport materials was conducted with a photoelectron spectrometer (Photoemission Yield Spectroscopy in Air) AC-2 (manufactured by RIKEN KEIKI Co., Ltd.).

Example 1

(Manufacturing Photoelectric Conversion Element and Evaluation Thereof)

By the sputtering method, a glass substrate with an ITO thin film (anode) with a thickness of 150 nm formed thereon was prepared. The glass substrate was subjected to ozone UV treatment as a surface treatment.

Next, the hole transport material H-2 was filtered via a filter with a pore diameter of 0.45 μm. A suspension thus obtained by the filtration was applied on the ITO thin film on the glass substrate by the spin coating method, thereby obtaining a coated film of 40 nm.

Next, the glass substrate with the coated film thereon was heated in an atmosphere by using a hot plate under conditions of 200° C. for 10 min, in order to dry the coated film, thereby forming a hole transport layer on the ITO thin film.

Next, the p-type semiconductor material P-1 and the n-type semiconductor material N-1 were mixed together at a weight ratio of 1:1.5 to obtain a mixture, and o-dichlorobenzene was added as a solvent in the mixture. After that, the mixture was stirred at 80° C. for 14 hours, thereby preparing an ink (I-1).

A coated film was obtained by applying the ink (I-1) on the glass substrate with the hole transport layer thereon by the spin coating method, and dried for 5 min by using a hot plate heated to 70° C., in order to convert the coated film into a solidified film, thereby forming an active layer on the hole transport layer. The active layer thus formed was about 100 nm in thickness.

Next, a coating liquid was prepared by diluting 45 wt % isopropanol dispersion of nano particles of zinc oxide (particle diameter of 20 to 30 nm) (HTD-711Z, TAYCA) with 3-pentanol by 10 times parts by weight with respect to the isopropanol dispersion. The coating liquid thus obtained was applied on the active layer by the spin coating method thereby preparing a coated film of 40 nm in thickness. The coated film thus obtained was dried in a nitrogen gas atmosphere, thereby forming an electron transport layer on the active layer.

After that, in a resistance heating deposition device, a silver (Ag) layer of about 80 nm in thickness was formed as a cathode on the electron transport layer thus formed. By the steps described above, a photoelectric conversion element (light detecting element) was manufactured as a laminate formed on the glass substrate.

Next, a UV-curing sealing agent was applied around the laminate, and a glass substrate serving as a sealing substrate was adhered to the laminate. After that, UV light was radiated on the laminate, thereby sealing the laminate. The photoelectric conversion element thus obtained had a square shape of 2 mm×2 mm when viewed from above in the thickness direction thereof.

Current density-voltage characteristics of the photoelectric conversion element thus manufactured was measured in dark and under radiation of quasi-solar light (1 SUN) by using a solar simulator CEP-2000 (manufactured by Bunkoukeiki Co., Ltd.), thereby obtaining measurement values.

Next, by using the measurement values thus obtained and the calculation equation explained above, an SN ratio under 0V voltage application was calculated out. Results are shown on Table 4 below.

Example 2 and Comparative Examples 1 to 3

Photoelectric conversion elements (light detecting elements) were manufactured as in Example 1 described above and were evaluated as in Example 1, except that the n-type semiconductor material and the material of the hole transport layer were changed as shown on Table 4 below. Results are shown on Table 4 below.

Examples 3 and 4 and Comparative Example 4

Photoelectric conversion elements (light detecting elements) were manufactured as in Example 1 described above, except that the n-type semiconductor material and the material of the hole transport layer were changed as shown on Table 5 below.

The photoelectric conversion element thus manufactured was immersed in liquid nitrogen, and current density-voltage characteristics in dark and under the radiation of the quasi-solar light were measured by using the solar simulator CEP-2000 (manufactured by Bunkoukeiki Co., Ltd.), while the photoelectric conversion element was being cooled as such, thereby obtaining measurement values.

Note that, the reason why the photoelectric conversion elements had to be cooled in liquid nitrogen in measuring the current density-voltage characteristics in Examples 3 and 4 and Comparative Example 4 was because the polymer compound P-2 is narrow in band gap and therefore the electrons would be thermally excited if at ambient temperatures and consequently diode characteristics of the polymer compound P-2 would be disappeared.

TABLE 5

|  | Example 3 | Example 4 | Comparative Example 4 |
|---|---|---|---|
| p-type semiconductor material | P-2 | P-2 | P-2 |
| n-type semiconductor material | N-1 | N-2 | N-2 |
| Hole transport material | H-4 | H-1 | H-4 |
| Absorption peak wavelength of p-type semiconductor material (nm) | 1513 | 1513 | 1513 |
| ΔE(eV) | 0.72 | 0.57 | 0.90 |
| Jsc(A/cm$^2$) | $4.2 \times 10^{-2}$ | $1.3 \times 10^{-1}$ | $5.5 \times 10^{-2}$ |
| Jd(A/cm$^2$) | $3.1 \times 10^{-5}$ | $3.1 \times 10^{-5}$ | $6.2 \times 10^{-5}$ |
| SN ratio | $1.4 \times 10^3$ | $4.2 \times 10^3$ | $8.8 \times 10^2$ |

TABLE 4

|  | Example 1 | Example 2 | Comparative Example 1 | Comparative Example 2 | Comparative Example 3 |
|---|---|---|---|---|---|
| p-type semiconductor material | P-1 | P-1 | P-1 | P-1 | P-1 |
| n-type semiconductor material | N-1 | N-2 | N-2 | N-2 | N-3 |
| Hole transport material | H-4 | H-2 | H-4 | H-5 | H-4 |
| Absorption peak wavelength of p-type semiconductor material (nm) | 921 | 921 | 921 | 921 | 921 |
| ΔE(eV) | 0.72 | 0.60 | 0.90 | 1.30 | 0.92 |
| Jsc(mA/cm$^2$) | 4.7 | 8.0 | 5.8 | 4.6 | 3.1 |
| Jd(mA/cm$^2$) | $1.8 \times 10^{-6}$ | $3.5 \times 10^{-6}$ | $3.2 \times 10^{-6}$ | $2.7 \times 10^{-6}$ | $4.9 \times 10^{-6}$ |
| SN ratio | $2.7 \times 10^6$ | $2.3 \times 10^6$ | $1.8 \times 10^6$ | $1.7 \times 10^6$ | $6.4 \times 10^5$ |

The photoelectric conversion elements of Examples 1 and 2, which satisfied the requirements that the absorption peak wavelength of the p-type semiconductor materials used was 900 nm or higher and ΔE is less than 0.9 eV were greater in SN ratio than the photoelectric conversion elements of Comparative Examples 1 to 3, which did not satisfy the requirement that ΔE is less than 0.9 eV.

The photoelectric conversion elements of Examples 3 and 4, which satisfied the requirements that the absorption peak wavelength of the p-type semiconductor materials used was 900 nm or higher and ΔE is less than 0.9 eV were significantly greater in SN ratio than the photoelectric conversion elements of Comparative Example 4, which did not satisfy the requirement that ΔE is less than 0.9 eV.

Comparative Examples 5 to 8

Photoelectric conversion elements (light detecting elements) were manufactured as in Example 1 described above and were evaluated as in Example 1, except that the n-type semiconductor material and the hole transport material were changed as shown on Table 6 below. Results are shown on Table 6 below.

TABLE 6

|  | Comparative Example 5 | Comparative Example 6 | Comparative Example 7 | Comparative Example 8 |
| --- | --- | --- | --- | --- |
| p-type semiconductor material | P-3 | P-3 | P-3 | P-3 |
| n-type semiconductor material | N-1 | N-2 | N-2 | N-3 |
| Hole transport material | H-4 | H-2 | H-4 | H-4 |
| Absorption peak wavelength of p-type semiconductor material (nm) | 801 | 801 | 801 | 801 |
| $\Delta E(eV)$ | 0.72 | 0.60 | 0.90 | 0.92 |
| $Jsc(A/cm^2)$ | 4.0 | 9.8 | 9.7 | 10.9 |
| $Jd(A/cm^2)$ | $3.5 \times 10^{-6}$ | $4.0 \times 10^{-5}$ | $8.6 \times 10^{-6}$ | $9.2 \times 10^{-6}$ |
| SN ratio | $1.1 \times 10^6$ | $2.4 \times 10^5$ | $1.1 \times 10^6$ | $1.2 \times 10^6$ |

As understood from Comparative Examples 5 to 8, in case where the polymer compound P-3 was used, which does not satisfy the requirement that the p-type semiconductor material used have an absorption peak wavelength of 900 nm or higher, a high SN ratio was not obtained even if ΔE was less than 0.9 eV.

Comparative Examples 9 to 13

Photoelectric conversion elements (light detecting elements) were manufactured as in Example 1 described above and were evaluated as in Example 1, except that the n-type semiconductor material and the hole transport material were changed as shown on Table 7 below. Results are shown on Table 7 below.

TABLE 7

|  | Comparative Example 9 | Comparative Example 10 | Comparative Example 11 | Comparative Example 12 | Comparative Example 13 |
| --- | --- | --- | --- | --- | --- |
| p-type semiconductor material | P-4 | P-4 | P-4 | P-4 | P-4 |
| n-type semiconductor material | N-1 | N-2 | N-2 | N-2 | N-3 |
| Hole transport material | H-2 | H-2 | H-3 | H-4 | H-4 |
| Absorption peak wavelength of p-type semiconductor material (nm) | 512 | 512 | 512 | 512 | 512 |
| $\Delta E(eV)$ | 0.72 | 0.60 | 0.70 | 0.90 | 0.92 |
| $Jsc(A/cm^2)$ | 2.4 | 3.9 | 4.1 | 2.1 | 2.9 |
| $Jd(A/cm^2)$ | $6.1 \times 10^{-6}$ | $3.6 \times 10^{-4}$ | $6.5 \times 10^{-6}$ | $1.5 \times 10^{-6}$ | $1.2 \times 10^{-6}$ |
| SN ratio | $4.0 \times 10^5$ | $1.1 \times 10^4$ | $4.0 \times 10^5$ | $1.4 \times 10^6$ | $2.5 \times 10^6$ |

As understood from Comparative Examples 9 to 13, in case where the polymer compound P-4 was used, which does not satisfy the requirement that the p-type semiconductor material used have an absorption peak wavelength of 900 nm or higher, a high SN ratio was not obtained even if ΔE was less than 0.9 eV.

DESCRIPTION OF REFERENCE SIGNS

1 Image detecting section
2 Display device
10 Photoelectric conversion element
11, 210 Support substrate
12 Anode
13 Hole transport layer
14 Active layer
15 Electron transport layer
16 Cathode
17 Sealing member
20 CMOS transistor substrate
30 Interlayer insulating film
32 Interlayer wiring section
40 Sealing layer
50 Color filter
100 Fingerprint Detecting Section
200 Display panel section
200a Display region
220 Organic EL element
230 Touch sensor panel
240 Sealing substrate

The invention claimed is:

1. A photoelectric conversion element, comprising an anode, a cathode, an active layer provided between the anode and the cathode, and a hole transport layer provided between the anode and the active layer, wherein the active layer includes a p-type semiconductor material, which is a polymer compound having an absorption peak wavelength of 900 nm or higher, and an n-type semiconductor material, and an energy gap between an Lowest Unoccupied Molecular Orbital (LUMO) of the n-type semiconductor material contained in the active layer and a Highest Occupied Molecular Orbital (HOMO) of a hole transport material contained in the hole transport layer is less than 0.9 eV, wherein the photoelectric conversion element has a signal-to-noise ratio of 1.4×103 or greater.

2. The photoelectric conversion element according to claim 1, wherein the absorption peak wavelength of the p-type semiconductor material is not less than 900 nm but not more than 2000 nm, and the energy gap is in a range of 0.5 eV to 0.8 eV.

3. The photoelectric conversion element according to claim 2, wherein the n-type semiconductor material is a fullerene derivative.

4. The photoelectric conversion element according to claim 2, wherein the p-type semiconductor material is a polymer compound having a structural unit having a thiophene skeleton.

5. The photoelectric conversion element according to claim 2, being a light detecting element.

6. The photoelectric conversion element according to claim 1, wherein the n-type semiconductor material is a fullerene derivative.

7. The photoelectric conversion element according to claim 6, wherein the fullerene derivative is one or more compounds selected from the group consisting of compounds represented by formulae (N-a) to (N-f) below,

[Chem. 1]

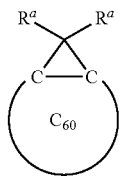
(N-a)

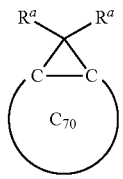
(N-b)

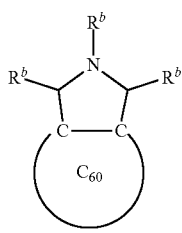
(N-c)

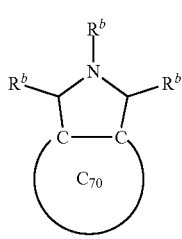
(N-d)

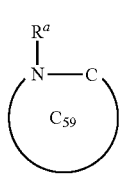
(N-e)

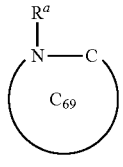
(N-f)

wherein $R^a$ is an alkyl group, an aryl group, a monovalent heterocyclic group, or a group having an ester structure, where if there are a plurality of $R^a$ in the formula, the plurality of $R^a$ may be identical with or different from one another, and $R^b$ is an alkyl group or an aryl group, where if there are a plurality of $R^b$ in the formula, the plurality of $R^b$ may be identical with or different from one another.

8. The photoelectric conversion element according to claim 7, wherein the fullerene derivative is the compound represented by formula (N-a), (N-b), (N-e), or (N-f).

9. The photoelectric conversion element according to claim 8, wherein the fullerene derivative is $C_{60}$PCBM or KLOC-6.

10. The photoelectric conversion element according to claim 9, wherein the p-type semiconductor material is a polymer compound having a structural unit having a thiophene skeleton.

11. The photoelectric conversion element according to claim 6, wherein the p-type semiconductor material is a polymer compound having a structural unit having a thiophene skeleton.

12. The photoelectric conversion element according to claim 6, being a light detecting element.

13. The photoelectric conversion element according to claim 7, wherein the p-type semiconductor material is a polymer compound having a structural unit having a thiophene skeleton.

14. The photoelectric conversion element according to claim 7, being a light detecting element.

15. The photoelectric conversion element according to claim 8, wherein the p-type semiconductor material is a polymer compound having a structural unit having a thiophene skeleton.

16. The photoelectric conversion element according to claim 8, being a light detecting element.

17. The photoelectric conversion element according to claim 9, being a light detecting element.

18. The photoelectric conversion element according to claim 1, wherein the p-type semiconductor material is a polymer compound having a structural unit having a thiophene skeleton.

19. The photoelectric conversion element according to claim 18, being a light detecting element.

20. The photoelectric conversion element according to claim 1, being a light detecting element.

21. The photoelectric conversion element according to claim 1, wherein the hole transport layer is at least one selected from the group consisting of: polythiophene and derivatives thereof; aromatic amine compounds; polymer compounds comprising a structural unit comprising an aromatic amine residue; CuSCN; CuI; NiO; $WO_3$; and $MoO_3$.

22. The photoelectric conversion element according to claim 1, wherein the hole transport material has a HOMO having a value in the range of −4.0 eV to −6.0 eV.

* * * * *